(12) United States Patent
Yu et al.

(10) Patent No.: US 10,121,791 B2
(45) Date of Patent: Nov. 6, 2018

(54) MULTI-GATE TRANSISTOR

(71) Applicant: Samsung Electronics Co., Ltd., Suwon-si, Gyeonggi-do (KR)

(72) Inventors: Hyun Kwan Yu, Suwon-si (KR); Hyo Jin Kim, Hwaseong-si (KR); Dong Suk Shin, Yongin-si (KR); Ji Hye Yi, Suwon-si (KR); Ryong Ha, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/819,309

(22) Filed: Nov. 21, 2017

(65) Prior Publication Data

US 2018/0211959 A1    Jul. 26, 2018

(30) Foreign Application Priority Data

Jan. 24, 2017 (KR) .......................... 10-2017-0010802

(51) Int. Cl.
*H01L 29/08* (2006.01)
*H01L 29/66* (2006.01)
(Continued)

(52) U.S. Cl.
CPC ...... *H01L 27/0924* (2013.01); *H01L 29/0869* (2013.01); *H01L 29/0886* (2013.01);
(Continued)

(58) Field of Classification Search
CPC ............. H01L 29/0869; H01L 29/0886; H01L 29/0843–29/0856; H01L 29/66484; H01L 29/66636; H01L 29/41791; H01L 2029/7857–2029/7858; H01L 29/06–29/0603; H01L 29/0657; H01L 29/0684; H01L 29/0688; H01L 29/66795–29/66818; H01L 29/785–29/7856; H01L 29/04–29/045; H01L 29/16–29/1608; H01L 29/18–29/185; H01L 29/22–29/2206; H01L 29/36–29/365; H01L 21/823431;
(Continued)

(56) References Cited

U.S. PATENT DOCUMENTS 6,791,200 B2    9/2004   Nii
7,470,570 B2 *  12/2008  Beintner ........... H01L 29/66795
                                              257/E29.13
(Continued)

*Primary Examiner* — Maliheh Malek
(74) *Attorney, Agent, or Firm* — Onello & Mello, LLP.

(57) ABSTRACT

A semiconductor device includes a substrate, first through fourth gate electrodes, and first through fifth fin active pattern. A first recess which is formed in the substrate between the first and second gate electrodes intersecting the second fin active pattern, is filled with a first source/drain region, and has a first depth in a third direction perpendicular to the first and second directions. A second recess which is formed in the substrate between the third and fourth gate electrodes intersecting the second fin active pattern, is filled with a second source/drain region, and has a second depth in the third direction. A third recess which is formed in the substrate between the second and third gate electrodes intersecting the second fin active pattern, is filled with a third source/drain region, and has a third depth in the third direction. The third depth is greater than the first and second depths.

20 Claims, 20 Drawing Sheets

(51) Int. Cl.
*H01L 27/092* (2006.01)
*H01L 27/088* (2006.01)
*H01L 29/06* (2006.01)
*H01L 29/423* (2006.01)

(52) U.S. Cl.
CPC ...... *H01L 29/0657* (2013.01); *H01L 29/0847* (2013.01); *H01L 29/4238* (2013.01); *H01L 29/66484* (2013.01); *H01L 29/66636* (2013.01)

(58) Field of Classification Search
CPC ........... H01L 21/823821; H01L 21/845; H01L 27/0886; H01L 27/0924; H01L 27/10826; H01L 27/10879; H01L 27/1211; H01L 2924/13067
See application file for complete search history.

(56) References Cited

U.S. PATENT DOCUMENTS

| | | | | |
|---|---|---|---|---|
| 8,116,121 B2* | 2/2012 | Kawasaki | ............... | H01L 21/84 365/156 |
| 8,377,779 B1* | 2/2013 | Wang | ................ | H01L 29/66795 257/E21.421 |
| 8,574,995 B2* | 11/2013 | Jeng | ............... | H01L 21/823431 438/305 |
| 8,603,893 B1* | 12/2013 | Wei | .................. | H01L 21/76229 257/E21.546 |
| 8,772,120 B2* | 7/2014 | Chang | ............. | H01L 21/823412 438/285 |
| 8,796,093 B1* | 8/2014 | Cheng | ............... | H01L 29/66545 257/327 |
| 8,847,361 B2 | 9/2014 | Liaw et al. | | |
| 9,041,115 B2 | 5/2015 | Liaw | | |
| 9,166,024 B2* | 10/2015 | Hung | ............... | H01L 29/66795 |
| 9,337,204 B2 | 5/2016 | Calhoun et al. | | |
| 9,362,290 B2 | 6/2016 | Liaw et al. | | |
| 9,418,189 B2 | 8/2016 | Lin et al. | | |
| 9,431,253 B1* | 8/2016 | Tan | ................... | H01L 27/11521 |
| 9,508,727 B2 | 11/2016 | Park et al. | | |
| 9,536,946 B2 | 1/2017 | Park et al. | | |
| 9,595,611 B2* | 3/2017 | Kim | ...................... | H01L 29/785 |
| 9,679,977 B2* | 6/2017 | Kim | .................. | H01L 29/41783 |
| 9,679,978 B2* | 6/2017 | Kim | .................. | H01L 29/41791 |
| 9,806,070 B2 | 10/2017 | Liaw | | |
| 9,842,909 B2* | 12/2017 | Maeda | .................. | H01L 29/665 |
| 9,871,042 B2* | 1/2018 | Kim | ...................... | H01L 21/845 |
| 9,935,017 B2* | 4/2018 | You | ................. | H01L 21/823828 |
| 9,941,174 B2* | 4/2018 | Choi | ............... | H01L 21/823814 |
| 9,947,756 B2* | 4/2018 | Li | ..................... | H01L 29/41791 |
| 9,960,241 B2* | 5/2018 | Park | .................. | H01L 29/41791 |
| 2007/0138523 A1 | 6/2007 | Popp | ............... | H01L 27/10876 257/296 |
| 2013/0280903 A1 | 10/2013 | Liaw et al. | | |
| 2013/0292777 A1 | 11/2013 | Liaw | | |
| 2014/0239255 A1* | 8/2014 | Kang | .................... | H01L 29/775 257/24 |
| 2014/0264279 A1* | 9/2014 | Cheng | ................. | H01L 29/7853 257/27 |
| 2014/0299934 A1* | 10/2014 | Kim | .................... | H01L 29/7848 257/347 |
| 2014/0312427 A1* | 10/2014 | Maeda | ................. | H01L 27/0924 257/369 |
| 2015/0035061 A1* | 2/2015 | Yoon | ................. | H01L 29/66545 257/365 |
| 2015/0091059 A1* | 4/2015 | Hung | ................ | H01L 29/66795 257/192 |
| 2015/0113492 A1 | 4/2015 | Lin et al. | | |
| 2015/0147857 A1 | 5/2015 | Calhoun et al. | | |
| 2015/0221654 A1 | 8/2015 | Kim et al. | | |
| 2015/0303250 A1 | 10/2015 | Ishikawa | | |
| 2016/0005838 A1* | 1/2016 | Hung | ................ | H01L 29/66795 438/283 |
| 2016/0056155 A1 | 2/2016 | Park et al. | | |
| 2016/0087053 A1* | 3/2016 | Kim | .................. | H01L 29/41783 257/369 |
| 2016/0133632 A1 | 5/2016 | Park et al. | | |
| 2016/0190141 A1* | 6/2016 | Lee | ..................... | H01L 27/1104 257/390 |
| 2016/0211251 A1 | 7/2016 | Liaw | | |
| 2016/0225680 A1 | 8/2016 | Logan et al. | | |
| 2016/0284697 A1* | 9/2016 | Yoon | ..................... | H01L 27/088 |
| 2016/0293697 A1* | 10/2016 | Kim | .................... | H01L 27/0924 |
| 2016/0293717 A1* | 10/2016 | Kim | .................... | H01L 29/41791 |
| 2016/0359012 A1* | 12/2016 | Yu | ........................ | H01L 29/4991 |
| 2017/0092728 A1* | 3/2017 | Kim | .................... | H01L 29/41791 |
| 2017/0110327 A1* | 4/2017 | Kim | .................... | H01L 21/3065 |
| 2017/0110581 A1* | 4/2017 | Shin | ..................... | H01L 29/7848 |
| 2017/0117411 A1* | 4/2017 | Kim | .................... | H01L 27/1104 |
| 2017/0133379 A1* | 5/2017 | Kim | .................... | H01L 27/0924 |
| 2017/0148797 A1* | 5/2017 | Kim | .................... | H01L 23/5283 |
| 2017/0154991 A1* | 6/2017 | Ko | ...................... | H01L 29/0649 |
| 2017/0162576 A1* | 6/2017 | Kim | .................... | H01L 27/0924 |
| 2017/0170054 A1* | 6/2017 | Kim | .................... | H01L 21/76224 |
| 2017/0194158 A1* | 7/2017 | Yu | ...................... | H01L 21/02057 |
| 2017/0213826 A1* | 7/2017 | Kim | ................ | H01L 21/823431 |
| 2017/0221907 A1* | 8/2017 | Hsieh | .................. | H01L 27/0886 |
| 2017/0236815 A1* | 8/2017 | Liu | ..................... | H01L 27/0207 257/401 |
| 2017/0243944 A1* | 8/2017 | Li | ........................ | H01L 29/0649 |
| 2017/0255735 A1* | 9/2017 | Kim | ..................... | G06F 17/5072 |
| 2017/0263722 A1* | 9/2017 | You | ................... | H01L 29/41791 |
| 2017/0271476 A1* | 9/2017 | Jang | ....................... | H01L 21/265 |
| 2017/0345911 A1* | 11/2017 | Yu | .................. | H01L 21/823418 |
| 2017/0365604 A1* | 12/2017 | Suh | .................... | H01L 27/0924 |
| 2018/0026024 A1* | 1/2018 | Okagaki | ............. | H01L 27/0207 |
| 2018/0026032 A1* | 1/2018 | Yoon | .................. | H01L 29/7848 |
| 2018/0083130 A1* | 3/2018 | Matsuura | ............ | H01L 29/0696 |
| 2018/0090589 A1* | 3/2018 | Yu | .................... | H01L 27/0886 |
| 2018/0096845 A1* | 4/2018 | Lee | .................. | H01L 21/02661 |
| 2018/0096935 A1* | 4/2018 | Kim | .................. | H01L 21/76895 |
| 2018/0114791 A1* | 4/2018 | Kim | ...................... | H01L 21/845 |
| 2018/0130799 A1* | 5/2018 | Shimbo | .................. | H01L 21/845 |
| 2018/0130886 A1* | 5/2018 | Kim | .................... | H01L 29/41725 |
| 2018/0138269 A1* | 5/2018 | Kim | .................... | H01L 29/0847 |

* cited by examiner

MULTI-GATE TRANSISTOR

This application claims priority under 35 USC § 119 from Korean Patent Application No. 10-2017-0010802, filed on Jan. 24, 2017, the disclosure of which is hereby incorporated by reference in its entirety.

BACKGROUND

1. Technical Field

The present inventive concepts relate to a semiconductor device.

2. Description of the Related Art

A multi-gate transistor has been used as a scaling technique for increasing the density of a semiconductor device. The multi-gate transistor is obtained by forming a fin- or nanowire-shaped multi-channel active pattern (or silicon body) on a substrate and forming a gate on the surface of the multi-channel active pattern.

The multi-gate transistor can be easily scaled as a three-dimensional (3D) channel is used. In addition, a current control capability of the multi-gate transistor can be improved without increasing a gate length of the multi-gate transistor. Moreover, a short channel effect (SCE) in which an electric potential of a channel region is affected by a drain voltage may be effectively suppressed.

SUMMARY

Some embodiments of the present inventive concepts provide a semiconductor device having improved reliability by preventing the formation of a bridge under a contact.

In one aspect, the present inventive concepts are directed to a semiconductor device, a substrate, first through fourth gate electrodes which extend in a first direction on the substrate and are sequentially separated from each other in a second direction perpendicular to the first direction, a first fin active pattern which extends in the second direction and intersects the second and third gate electrodes, a second fin active pattern which extends in the second direction, is separated from the first fin active pattern in the first direction, and intersects the first through fourth gate electrodes, a third fin active pattern which extends in the second direction, is separated from the second fin active pattern in the first direction, and intersects the first and second gate electrodes, a fourth fin active pattern which extends in the second direction, is separated from the third fin active pattern in the second direction, and intersects the third and fourth gate electrodes, a fifth fin active pattern which extends in the second direction, is separated from the third and fourth fin active patterns in the first direction, and intersects the first through fourth gate electrodes, a first recess in the substrate between the first and second gate electrodes intersecting the second fin active pattern, is filled with a first source/drain region, and has a first depth in a third direction perpendicular to the first and second directions, a second recess which is formed in the substrate between the third and fourth gate electrodes intersecting the second fin active pattern, is filled with a second source/drain region, and has a second depth in the third direction, and a third recess which is formed in the substrate between the second and third gate electrodes intersecting the second fin active pattern, is filled with a third source/drain region, and has a third depth in the third direction. The third depth is greater than the first depth and the second depth.

In another aspect, the present inventive concepts are directed to a semiconductor device, a substrate which comprises a first region and a second region, a first gate electrode which extends in a first direction on the first region, a second gate electrode which extends in the first direction on the first region and is separated from the first gate electrode in a second direction perpendicular to the first direction, a third gate electrode which extends in the first direction on the second region and is separated from the second gate electrode in the second direction, a fourth gate electrode which extends in the first direction on the second region and is separated from the third gate electrode in the second direction, a first fin active pattern which extends in the second direction on the first and second regions and intersects the first through fourth gate electrodes, a second fin active pattern which extends in the second direction on the first region, is separated from the first fin active pattern in the first direction, and intersects the first and second gate electrodes, a third fin active pattern which extends in the second direction on the second region, is separated from the second fin active pattern in the second direction, and intersects the third and fourth gate electrodes, a first source/drain region which is formed in the first region between the first and second gate electrodes intersecting the first fin active pattern and has a first depth in a third direction perpendicular to the first and second directions, a second source/drain region which is formed in the second region between the third and fourth gate electrodes intersecting the first fin active pattern and has a second depth in the third direction, and a third source/drain region which is formed in the first and second regions between the second and third gate electrodes intersecting the first fin active pattern and has a third depth in the third direction. The third depth is greater than the first depth and the second depth.

In another aspect, the present inventive concepts are directed to a semiconductor device including a substrate comprising a first region and a second region, a first gate electrode extending in a first direction on the first region, a second gate electrode extending in the first direction on the first region and being separated from the first gate electrode in a second direction perpendicular to the first direction, a third gate electrode extending in the first direction on the second region and being separated from the second gate electrode in the second direction, a fourth gate electrode extending in the first direction on the second region and being separated from the third gate electrode in the second direction, a plurality of fin active patterns extending in the second direction and spaced apart from each other in the first direction, a first source drain region in the first region between the first and second gate electrodes intersecting one of the plurality of fin active patterns and having a first depth in the third direction intersecting the one of the plurality of fin active pattern and having a first depth in a third direction perpendicular to the first and second directions, a second source/drain region in the second region between the third and fourth gate electrodes intersecting the one of the plurality of fin active pattern and having a second depth in the third direction; and a third source/drain region in the first and second regions between the second and third gate electrodes intersecting the one of the plurality of fin active pattern and having a third depth in the third direction. The third depth is greater than the first depth and the second depth.

BRIEF DESCRIPTION OF THE DRAWINGS

These and/or other aspects and advantages of the present general inventive concepts will become apparent and more

DETAILED DESCRIPTION

Figure 1:
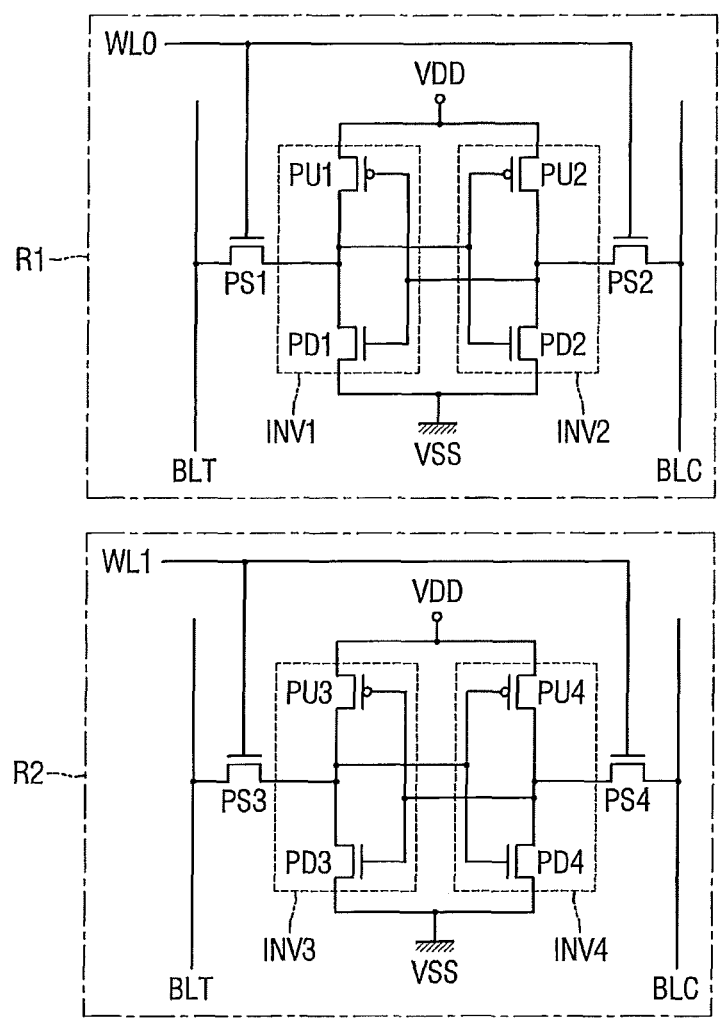
FIG. 1 is a circuit diagram of a semiconductor device according to some embodiments of the present inventive concepts.

Reference will now be made in detail to the embodiments of the present general inventive concepts, examples of which are illustrated in the accompanying drawings, wherein like reference numerals refer to the like elements throughout. The embodiments are described below in order to explain the present general inventive concepts by referring to the figures.

A circuit of a semiconductor device according to some embodiments of the present inventive concepts will now be described with reference to FIG. 1.

FIG. 1 is a circuit diagram of a semiconductor device according to some embodiments of the present inventive concepts.

Referring to FIG. 1, a first region R1 may include a first inverter INV1 and a second inverter INV2 connected in parallel between a power supply terminal VDD and a ground terminal VSS. The first region R1 may further include first and second pass gate transistors PS1 and PS2 connected to output terminals of the first and second inverters INV1 and INV2, respectively.

The first pass gate transistor PS1 and the second pass gate transistor PS2 may be connected to a true bit line BLT and a complementary bit line BLC, respectively. Gates of the first pass gate transistor PS1 and the second pass gate transistor PS2 may both be connected to a first word line WL0.

The first inverter INV1 may include a first pull-up transistor PU1 and a first pull-down transistor PD1 connected in series to each other. The second inverter INV2 may include a second pull-up transistor PU2 and a second pull-down transistor PD2 connected in series to each other.

The first pull-up transistor PU1 of the first inverter INV1 and the second pull-up transistor PU2 of the second inverter INV2 may be p-channel MOSFET (PMOS) transistors. The first pull-down transistor PD1 of the first inverter INV1 and the second pull-down transistor PD2 of the second inverter INV2 may be n-channel MOSFET (NMOS) transistors.

In order for the first inverter INV1 and the second inverter INV2 to form one latch circuit, an input terminal of the first inverter INV1 may be connected to the output terminal of the second inverter INV2, and an input terminal of the second inverter INV2 may be connected to the output terminal of the first inverter INV1. That is, gates of the first pull-up transistor PU1 and the first pull-down transistor PD1 may be connected to an output of the second inverter INV2 and the gates of the second pull-up transistor PU2 and the second pull-down transistor PU2 may be connected to an output of the first inverter INV1.

Opposite signals may be transmitted to the true bit line BLT and the complementary bit line BLC. In such an embodiment, the "opposite signals" denote signals having opposite binary digits or signs such as "1" and "0" or "+" and "−" in a digital circuit.

Similarly, a second region R2 may include a third inverter INV3 and a fourth inverter INV4 connected in parallel between a power supply terminal VDD and a ground terminal VSS. The second region R2 may further include third and fourth pass gate transistors PS3 and PS4 connected to output terminals of the third and fourth inverters INV3 and INV4, respectively.

The third pass gate transistor PS3 and the fourth pass gate transistor PS4 may be connected to a true bit line BLT and a complementary bit line BLC, respectively. Gates of the third pass gate transistor PS3 and the fourth pass gate transistor PS4 may both be connected to a second word line WL1.

The third inverter INV3 may include a third pull-up transistor PU3 and a third pull-down transistor PD3 connected in series to each other. The fourth inverter INV4 may include a fourth pull-up transistor PU4 and a fourth pull-down transistor PD4 connected in series to each other.

The third pull-up transistor PU3 of the third inverter INV3 and the fourth pull-up transistor PU4 of the fourth inverter INV4 may be PMOS transistors. The third pull-down transistor PD3 of the third inverter INV3 and the fourth pull-down transistor PD4 of the fourth inverter INV4 may be NMOS transistors.

In order for the third inverter INV3 and the fourth inverter INV4 to form one latch circuit, an input terminal of the third inverter INV3 may be connected to the output terminal of the fourth inverter INV4, and an input terminal of the fourth inverter INV4 may be connected to the output terminal of the third inverter INV3. That is, gates of the third pull-up transistor PU3 and the third pull-down transistor PD3 may be connected to an output of the fourth inverter INV4 and the gates of the fourth pull-up transistor PU4 and the fourth pull-down transistor PU4 may be connected to an output of the third inverter INV3.

Opposite signals may be transmitted to the true bit line BLT and the complementary bit line BLC. In such an embodiment, the "opposite signals" denote signals having opposite binary digits or signs such as "1" and "0" or "+" and "−" in a digital circuit.

A semiconductor device 100 according to some embodiments of the present inventive concepts will now be described with reference to FIG. 2 through FIG. 4.

Figure 2:
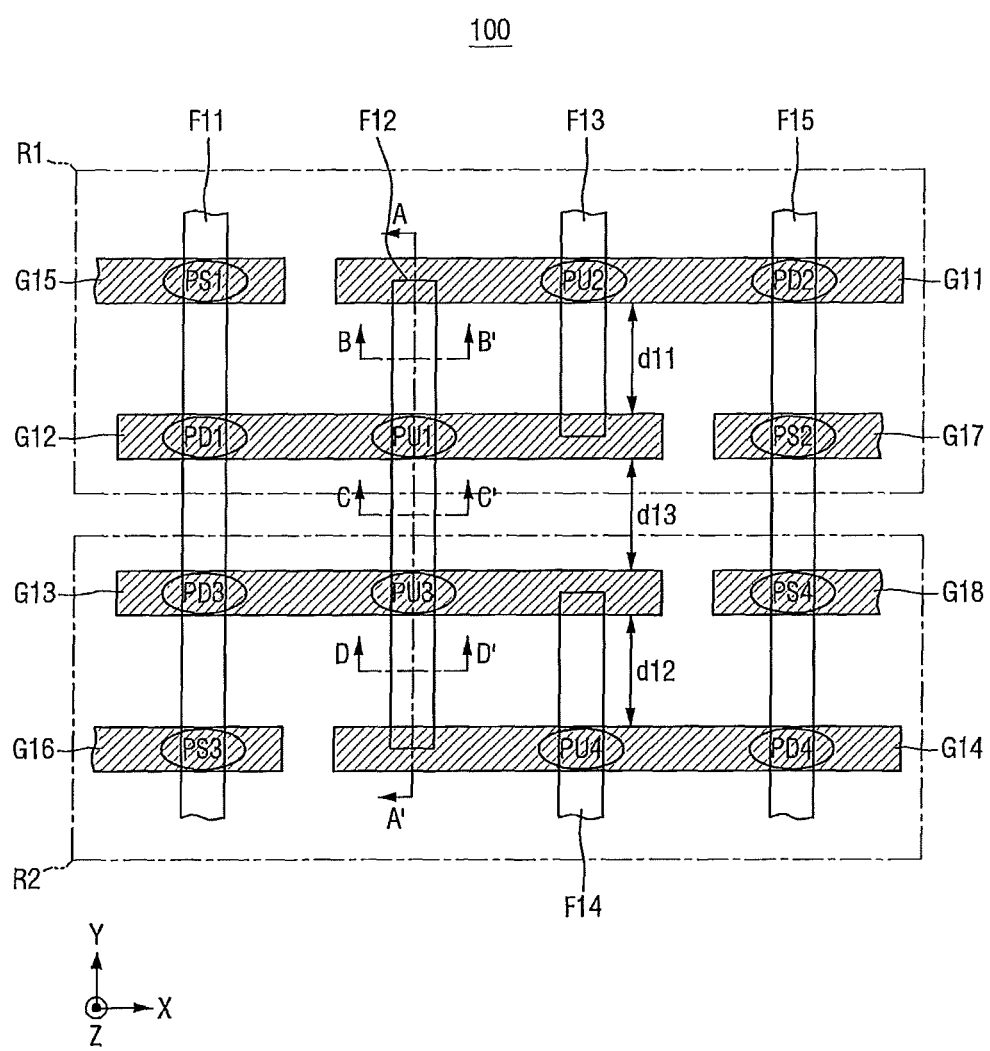
FIG. 2 is a layout view of a semiconductor device according to some embodiments of the present inventive concepts.

FIG. 2 is a layout view of the semiconductor device 100 according to some embodiments of the present inventive concepts. FIG. 3 is a cross-sectional view taken along line A-A' of FIG. 2. FIG. 4 is cross-sectional views taken along lines B-B', C-C', and D-D' of FIG. 2.

Referring to FIG. 1 and FIG. 2, a first fin active pattern F11 and a fifth gate electrode G15 may form the first pass gate transistor PS1 of the first region R1. A fifth fin active pattern F15 and a seventh gate electrode G17 may form the second pass gate transistor PS2 of the first region R1. Similarly, the first fin active pattern F11 and a sixth gate electrode G16 may form the third pass gate transistor PS3 of the second region R2. The fifth fin active pattern F15 and an eighth gate electrode G18 may form the fourth pass gate transistor PS4 of the second region R2.

The first fin active pattern F11 and a second gate electrode G12 may form the first pull-down transistor PD1 of the first inverter INV1. The fifth fin active pattern F15 and a first gate electrode G11 may form the second pull-down transistor PD2 of the second inverter INV2. Similarly, the first fin active pattern F11 and a third gate electrode G13 may form the third pull-down transistor PD3 of the third inverter INV3. The fifth fin active pattern F15 and a fourth gate electrode G14 may form the fourth pull-down transistor PD4 of the fourth inverter INV4.

A second fin active pattern F12 and the second gate electrode G12 may form the first pull-up transistor PU1 of the first inverter. A third fin active pattern F13 and the first gate electrode G11 may form the second pull-up transistor PU2 of the second inverter. Similarly, the second fin active pattern F12 and the third gate electrode G13 may form the third pull-up transistor PU3 of the third inverter INV3. A fourth fin active pattern F14 and the fourth gate electrode G14 may form the fourth pull-up transistor PU4 of the fourth inverter INV4.

Figure 3:
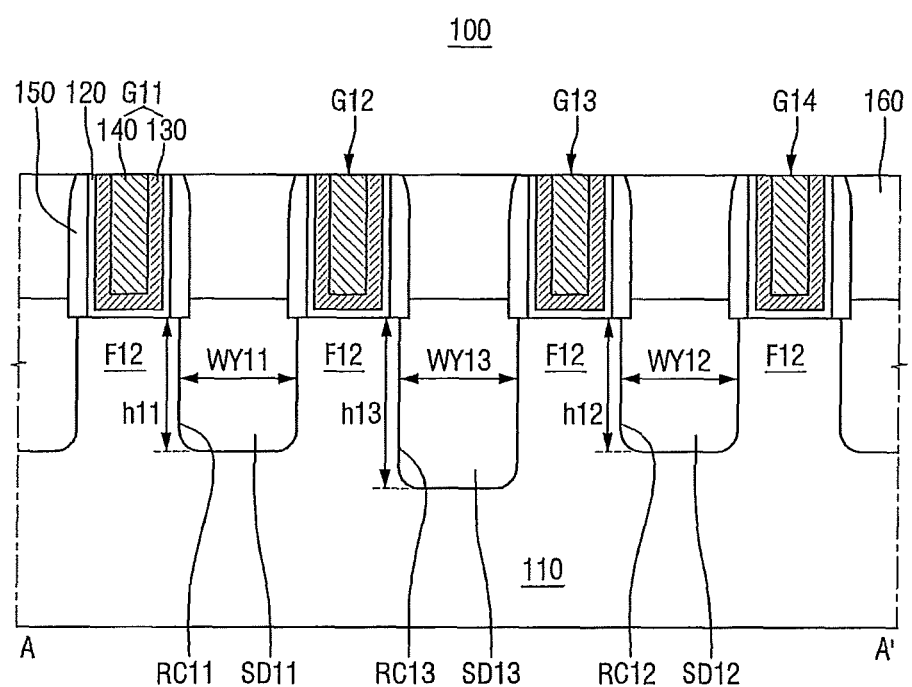
FIG. 3 is a cross-sectional view taken along a line A-A' of FIG. 2.
Figure 3:
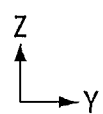
Figure 4:
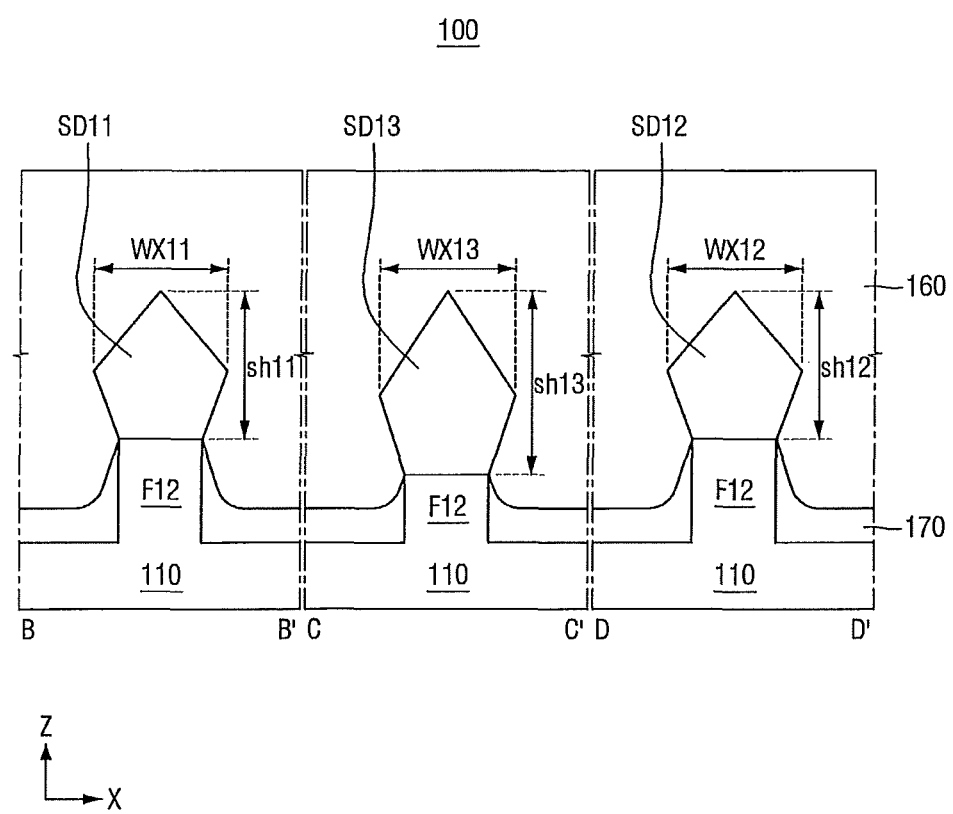
FIG. 4 is cross-sectional views taken along lines B-B', C-C', and D-D' of FIG. 2, respectively.

Referring to FIG. 2, FIG. 3 and FIG. 4, the semiconductor device 100 may include a substrate 110, the first through eighth gate electrodes G11 through G18, the first through fifth fin active patterns F11 through F15, first through third source/drain regions SD11 through SD13, a gate insulating layer 120, gate spacers 150, an interlayer insulating film 160, and a field insulating layer 170.

In some embodiments, the substrate 110 may be at least one of a bulk silicon substrate and a silicon-on-insulator (SOI) substrate. In some embodiments, the substrate 110 may be at least one of a silicon substrate and a substrate made of another material, for example, silicon germanium, indium antimonide, lead telluride, indium arsenide, indium phosphide, gallium arsenide or gallium antimonide. In some embodiments, the substrate 110 may include a base substrate and an epitaxial layer formed on the base substrate.

The substrate 110 may include the first region R1 and the second region R2. The first region R1 and the second region R2 may be adjacent to each other. For example, the first region R1 and the second region R2 may be adjacent to each other in a second direction Y as illustrated in FIG. 2. However, the present inventive concepts are not limited thereto. That is, in some embodiments, the first region R1 and the second region R2 may be separated from each other. A boundary line between the first region R1 and the second region R2 may extend in a first direction X. The first direction X is substantially perpendicular to the second direction Y.

The first region R1 and the second region R2 may include, for example, different static random access memory (SRAM) elements. In such an embodiment, a boundary region between the first region R1 and the second region R2 may be a middle point between the different SRAM elements.

Each of the first through eighth gate electrodes G11 through G18 may include a work function metal 130 and a fill metal 140. The work function metal 130 may control a work function, and the fill metal 140 may fill a space formed by the work function metal 130. The work function metal 130 may be at least one of an N-type work function metal, a P-type work function metal, and combinations of the N-type work function metal and the P-type work function metal. The work function metal 130 may be formed between the gate insulating layer 120 and the fill metal 140.

The first through eighth gate electrodes G11 through G18 may extend in the first direction X on the substrate 110. In addition, the first through eighth gate electrodes G11 through G18 may be separated from each other in the first direction X and the second direction Y.

Specifically, the first, second fifth and seventh gate electrodes G11, G12, G15 and G17, respectively, may be on the first region R1 of the substrate 110. The first gate electrode G11 may extend in the first direction X on the first region R1 of the substrate 110. The second gate electrode G12 may extend in the first direction X on the first region R1 of the substrate 110 and may be separated from the first gate electrode G11 and the fifth gate electrode G15 in the second direction Y perpendicular to the first direction X and may be separated from the seventh gate electrode G17 in the first direction X. The fifth gate electrode G15 may extend in the first direction X on the first region R1 of the substrate 110 and may be separated from the first gate electrode G11 in the first direction X and separated from the second gate electrode G12 in the second direction Y. The seventh gate electrode G17 may extend in the first direction X on the first region R1 of the substrate 110 and may be separated from the second gate electrode G12 in the first direction X and separated from the first gate electrode G11 in the second direction Y.

In addition, the third, fourth, sixth and eighth gate electrodes G13, G14, G16 and G18, respectively, may be on the second region R2 of the substrate 110. The third gate electrode G13 may extend in the first direction X on the second region R2 of the substrate 110 and may be separated from the second gate electrode G12 in the second direction Y on a first side of the third gate electrode G13 and separated from the sixth gate electrode G16 and the fourth gate electrode G14 in the second direction Y on a second side of the third gate electrode G13 which is opposite the first side on the third gate electrode G13. The third gate electrode G13 may be separated from the eighth gate electrode G18 in the first direction X. The fourth gate electrode G14 may extend in the first direction X on the second region R2 of the substrate 110 and may be separated from the third gate electrode G13 and the eighth gate electrode G18 in the second direction Y. The sixth gate electrode G16 may extend in the first direction X on the second region R2 of the substrate 110 and may be separated from the fourth gate electrode G14 in the first direction X and separated from the third gate electrode G13 in the second direction Y. The eighth gate electrode G18 may extend in the first direction X on the second region R2 of the substrate 110 and may be separated from the third gate electrode G13 in the first direction X and separated from the fourth gate electrode G14 in the second direction Y.

The first through eighth gate electrodes G11 through G18 may be formed by, for example, at least one of a replacement process and a gate last process; however, the present inventive concepts are not limited thereto.

The first through fifth fin active patterns F11 through F15 may extend in the second direction Y on the substrate 110. In addition, the first through fifth fin active patterns F11 through F15 may be separated from each other in the first direction X.

Specifically, the first fin active pattern F11 may extend in the second direction Y on the first and second regions R1 and R2 of the substrate 110. In addition, the first fin active pattern F11 may sequentially intersect the fifth gate electrode G15, the second gate electrode G12, the third gate electrode G13, and the sixth gate electrode G16. The first fin active pattern F11 may be separated from the second fin active pattern F12 in the first direction X.

The second fin active pattern F12 may extend in the second direction Y on the first and second regions R1 and R2 of the substrate 110 and may be separated from the first fin active pattern F11 in the first direction X on a first side of the second fin active pattern F12 and separated from the third fin active pattern F13 and the fourth fin active pattern F14 in the first direction X on a second side of the second fin active pattern F12 which is opposite the first side of the second fin active pattern F12. In addition, the second fin active pattern F12 may sequentially intersect the first gate electrode G11, the second gate electrode G12, the third gate electrode G13, and the fourth gate electrode G14.

The third fin active pattern F13 may extend in the second direction Y on the first region R1 of the substrate 110 and may be separated from the second fin active pattern F12 in the first direction X on a first side of the third fin active pattern F13 and separated from the fifth fin active pattern F15 in the first direction X on a second side of the third fin active pattern F13 which is opposite the first side of the third fin active pattern F13. The third fin active pattern F13 may be separated from the fourth fin active pattern F14 in the second direction Y. In addition, the third fin active pattern F13 may intersect the first gate electrode G11 and the second gate electrode G12.

The fourth fin active pattern F14 may extend in the second direction Y on the second region R2 of the substrate 110 and may be separated from the second fin active pattern F12 in the first direction X on a first side of the fourth fin active pattern F14, separated from the fifth fin active pattern F15 in the first direction X on a second side of the fourth fin active pattern F14 which is opposite the first side of the fourth fin active pattern F14, and separated from the third fin active pattern F13 in the second direction Y. In addition, the fourth fin active pattern F14 may intersect the third gate electrode G13 and the fourth gate electrode G14.

The fifth fin active pattern F15 may extend in the second direction Y on the first and second regions R1 and R2 of the substrate 110 and may be separated from the third and fourth fin active patterns F13 and F14 in the first direction X. In addition, the fifth fin active pattern F15 may sequentially intersect the first gate electrode G11, the seventh gate electrode G17, the eighth gate electrode G18, and the fourth gate electrode G14.

The first through eighth gate electrodes G11 through G18 and the first through fifth fin active patterns F11 through F15 may be arranged symmetrically with respect to the boundary line extending in the first direction X between the first region R1 and the second region R2. That is, the fifth gate electrode G15, the first gate electrode G11, the second gate electrode G12 and the seventh gate electrode G17 and the first fin active pattern F11, the second fin active pattern F12, the third fin active pattern F13 and the fifth fin active pattern F15 in the first region R1 are formed to be symmetrical with the sixth gate electrode G16, the fourth gate electrode G14, the third gate electrode G13 and the eighth gate electrode G18 and the first fin active pattern F11, the second fin active pattern F12, the fourth fin active pattern F14 and the fifth fin active pattern F15 in the second region R2. This symmetry is intended to minimize the dispersion of performance of the semiconductor device according to position, such as a threshold voltage of a gate electrode.

A first distance d11 between the first gate electrode G11 and the second gate electrode G12, a second distance d12 between the third gate electrode G13 and the fourth gate electrode G14, and a third distance d13 between the second gate electrode G12 and the third gate electrode G13 may be equal to each other. However, the present inventive concepts are not limited thereto. In some embodiments, the first gate electrode G11 may be spaced apart from, or separated from, both the second gate electrode G12 and the seventh gate electrode G17 by the first distance d11, and the fifth gate electrode G15 may be spaced apart from, or separated from, the second gate electrode G12 by the first distance d11. The second gate electrode G12 may be spaced apart from, or separated from, the third gate electrode G13 by the third distance d13, and the seventh gate electrode G17 may be spaced apart from, or separated from, the eighth gate electrode G18 by the third distance d13. The third gate electrode G13 may be spaced apart from, or separated from, both the sixth gate electrode G16 and the fourth gate electrode G14 by the second distance d12, and the eighth gate electrode G18 may be spaced apart from, or separated from, the fourth gate electrode G14 by the second distance d12.

Each of the first through fifth fin active patterns F11 through F15, respectively, may be formed by, for example, etching part of the substrate 110 or may include an epitaxial layer grown from the substrate 110.

Each of the first through fifth fin active patterns F11 through F15 may include, for example, an element semiconductor material such as silicon or germanium. In addition, each of the first through fifth fin active patterns F11 through F15 may include, for example, a compound semiconductor such as a group IV-IV compound semiconductor or a group III-V compound semiconductor.

Specifically, the group IV-IV compound semiconductor that forms each of the first through fifth fin active patterns F11 through F15 may be, for example, a binary or ternary compound including two or more of carbon (C), silicon (Si), germanium (Ge) and tin (Sn) or a compound obtained by doping the binary or ternary compound with a group IV element.

The group III-V compound semiconductor that forms each of the first through fifth fin active patterns F11 through F15 may be, for example, a binary, ternary, or quaternary compound composed of at least one of aluminum (Al), gallium (Ga) and indium (In) (that is, group III elements) bonded with one of phosphorus (P), arsenic (As) and antimony (Sb) (that is, group V elements).

In semiconductor devices according to some embodiments of the present inventive concepts, the first through fifth fin active patterns F11 through F15 will be described as including silicon.

The gate insulating layer 120 may be formed between the first through eighth gate electrodes G11 through G18 and between the first through fifth fin active patterns F11 through F15. In addition, the gate insulating layer 120 may be formed between the first through eighth gate electrodes G11 through G18 and the interlayer insulating film 160. That is, the gate insulating layer 120 may be formed along sidewalls and a bottom of each of the first through eighth gate electrodes G11 through G18.

The gate insulating layer 120 may include, for example, an interfacial layer and a high-dielectric constant (k) layer. The interfacial layer may be formed by oxidizing part of each of the first through fifth fin active patterns F11 through F15. The interfacial layer may be formed along the profile of each of the first through fifth fin active patterns F11 through F15 protruding above an upper surface of the field insulating layer 170. In an embodiment in which the first through fifth fin active patterns F11 through F15 are silicon fin patterns including silicon, the interfacial layer may include, for example, a silicon oxide layer. The interfacial layer may also be formed along the upper surface of the field insulating layer 170 depending on the formation method.

In addition, when the field insulating layer 170 includes silicon oxide and if physical properties of the silicon oxide included in the field insulating layer 170 are different from those of the silicon oxide layer included in the interfacial layer, the interfacial layer may be formed along the upper surface of the field insulating layer 170. The field insulating layer 170 may be formed between the interlayer insulating film 160 and an upper surface of the substrate 110 and along sidewalls of the first through fifth fin active patterns F11 through F15.

The high-k layer may be formed between the interfacial layer and the first through eighth gate electrodes G11 through G18. The high-k layer may be formed along the profile of each of the first through eighth gate electrodes G11 through G18, that is, surrounding the first through eighth gate electrodes G11 through G18, protruding above the upper surface of the field insulating layer 170. In addition, the high-k layer may be formed between the first through eighth gate electrodes G11 through G18 and the field insulating layer 170.

The high-k layer may include, for example, a high-k material having a higher dielectric constant than that of a silicon oxide layer. For example, the high-k layer may include one or more of, but not limited to, silicon oxynitride, silicon nitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

The gate spacers 150 may be disposed on sidewalls of each of the first through eighth gate electrodes G11 through G18 extending in the first direction X. The gate spacers 150 may include, for example, at least one of silicon nitride (SiN), silicon oxynitride (SiON), silicon oxide ($SiO_2$), silicon oxycarbonitride (SiOCN), and combinations of the same. The gate insulating layer 120 may be formed between the gate spacers 150 and each of the first through eighth gate electrodes G11 through G18.

Each of the gate spacers 150 is illustrated as a single layer in the drawings. However, each of the gate spacers 150 may also be formed as a multilayer spacer including multiple layers. The gate spacers 150 and the multilayer spacer that forms each of the gate spacers 150 may have an 'I' shape, an 'L,' shape, or a combination of the 'I' shape and the 'L' shape according to the manufacturing process or the purpose of use.

Source/drain regions may be formed on the first through fifth fin active patterns F11 through F15, as illustrated in FIG. 4, and on both sides of each of the first through eighth gate electrodes G11 through G18, as illustrated in FIG. 3.

For example, as illustrated in FIG. 3, the first source/drain region SD11 may be formed to fill a first recess RC11 formed in the first region R1 of the substrate 110 between the first and second gate electrodes G11 and G12 which intersect the second fin active pattern F12. The second source/drain region SD12 may be formed to fill a second recess RC12 formed in the second region R2 of the substrate 110 between the third and fourth gate electrodes G13 and G14 which intersect the second fin active pattern F12. The third source/drain SD13 may be formed to fill a third recess RC13 formed in the first and second regions R1 and R2 of the substrate 110 between the second and third gate electrodes G12 and G13 which intersect the second fin active pattern F12.

In such an embodiment, upper surfaces of the first through third source/drain regions SD11 through SD13 may be formed higher than an upper surface of the second fin active pattern F12. That is, a height from the substrate 110 to the upper surfaces of the first through third source/drain regions SD11 through SD13 may be greater than a height from the substrate 110 to the upper surface of the second fin active pattern F12, as illustrated in FIG. 3. The first through third source/drain regions SD11 through SD13 may be formed along a bottom and lower sidewalls of the gate spacers 150 and along a sidewall of the second fin active pattern F12.

Each of the first through third source/drain regions SD11 through SD13 may include an epitaxial layer formed by, for example, an epitaxial process. In addition, the first through third source/drain regions SD11 through SD13 may be, for example, elevated source/drain regions.

In an embodiment in which the first through third source/drain regions SD11 through SD13 are formed in a PMOS region, the first through third source/drain regions SD11 through SD13 may be, for example, SiGe epitaxial layers. In an embodiment in which the first through third source/drain regions SD11 through SD13 are formed in an NMOS region, the first through third source/drain regions SD11 through SD13 may be, for example, Si epitaxial layers. In such an embodiment, the first through third source/drain regions SD11 through SD13 may include, for example, SiP heavily doped with P.

Lower portions of the first through third recesses RC11 through RC13 may be U-shaped. Accordingly, lower portions of the first through third source/drain regions SD11 through SD13 that, respectively, fill the first through third recesses RC11 through RC13 may be U-shaped.

The first recess RC11 may have a first width WY11 in the second direction Y, the second recess RC12 may have a second width WY12 in the second direction Y, and the third recess RC13 may have a third width WY13 in the second direction Y.

In such an embodiment, the first through third widths WY11 through WY13 may be equal to each other. The first width WY11 in the second direction Y of the first source/drain region SD11, which fills the first recess RC11, the second width WY12 in the second direction Y of the second source/drain region SD12, which fills the second recess RC12, and the third width WY13 in the second direction Y of the third source/drain region SD13, which fills the third recess RC13 may be equal to each other. However, the present inventive concepts are not limited thereto. That is, in some embodiments, at least one of the first through third widths WY11 through WY13 in the second direction Y may be different from the other widths of the first through third widths WY11 through WY13 in the second direction Y.

The first recess RC11 may have a first depth h11 in a third direction Z perpendicular to the first and second directions X and Y from a top of the second fin active pattern F12 to the bottom of the first recess RC11, the second recess RC12 may have a second depth h12 in the third direction Z from a top of the second fin active pattern F12 to the bottom of the second recess RC12, and the third recess RC13 may have a third depth h13 in the third direction Z from a top of the second fin active pattern F12 to the bottom of the third recess RC13.

In such an embodiment, the first depth h11 and the second depth h12 may be equal, and the third depth h13 may be greater than the first depth h11 and the second depth h12. Accordingly, a first depth sh11 in the third direction Z of the first source/drain region SD11, which fills the first recess RC11 and a second depth sh12 in the third direction Z of the second source/drain region SD12, which fills the second recess RC12 may be equal to each other. In addition, a third depth sh13 in the third direction Z of the third source/drain region SD13, which fills the third recess RC13 may be greater than the first depth sh11 of the first source/drain region SD11 and the second depth sh12 of the second source/drain region SD12, as illustrated in FIG. 4. However, the present inventive concepts are not limited thereto. That is, in some embodiments, the first depth h11 of the first recess RC11 and the second depth h12 of the second recess RC12 may be different from each other, and the first depth sh11 of the first source/drain region SD11 and the second depth sh12 of the second source/drain region SD12 may be different from each other.

Referring to FIG. 4, the first source/drain region SD11 may have a fourth width WX11 in the first direction X, the second source/drain region SD12 may have a fifth width WX12 in the first direction X, and the third source/drain region SD13 may have a sixth width WX13 in the first direction X. The fourth through sixth widths WX11 through WX13 in the first direction X are the largest or outermost widths of the first through third source/drain regions SD11 through SD13, respectively, in the first direction X, as the widths of the fourth through sixth widths WX11 through WX13 of the first through third source/drain regions SD11 through SD13, respectively, may vary from a top of the first through third source drain regions SD11 through SD13 to the bottom of the first through third source drain regions SD11 through SD13, respectively. That is, the largest width, or the outermost width, in the first direction X of the first through third source drain regions SD11 through SD13 may be at a middle portion thereof. In some embodiments, the first through third source drain regions SD11 through SD13 may have a pentagon shape.

In such an embodiment, the fourth through sixth widths WX11 through WX13 may be equal to each other. However, the present inventive concept is not limited thereto. That is, in some embodiments, at least one of the fourth through sixth widths WX11 through WX13 may be different from the other widths of the fourth through sixth widths WX11 through WX13.

Consequently, in the semiconductor device 100 according to some embodiments of the present inventive concepts, the third depth h13 of the third recess RC3 formed at a middle point between the first region R1 and the second region R2 of the substrate 110 may be greater than the first depth h11 of the first recess RC1 and the second depth h12 of the second recess RC2.

That is, a volume inside the third recess RC3 may be larger than a volume inside the first recess RC1 and a volume inside the second recess RC2.

Therefore, the third source/drain region SD13 may be prevented from overgrowing while the first and second source/drain regions SD12 and SD13 may be formed in the first and second recesses RC1 and RC2, respectively. As a result, the formation of a bridge under a contact may be prevented.

A semiconductor device 200 according to some embodiments of the inventive concepts will now be described with reference to FIG. 5 through FIG. 7. The semiconductor device 200 according to the embodiment of FIG. 5 through FIG. 7 will be described, focusing mainly on differences between the semiconductor device 200 of FIG. 5 through FIG. 7 and the semiconductor device 100 of FIG. 2 through FIG. 4.

Figure 5:
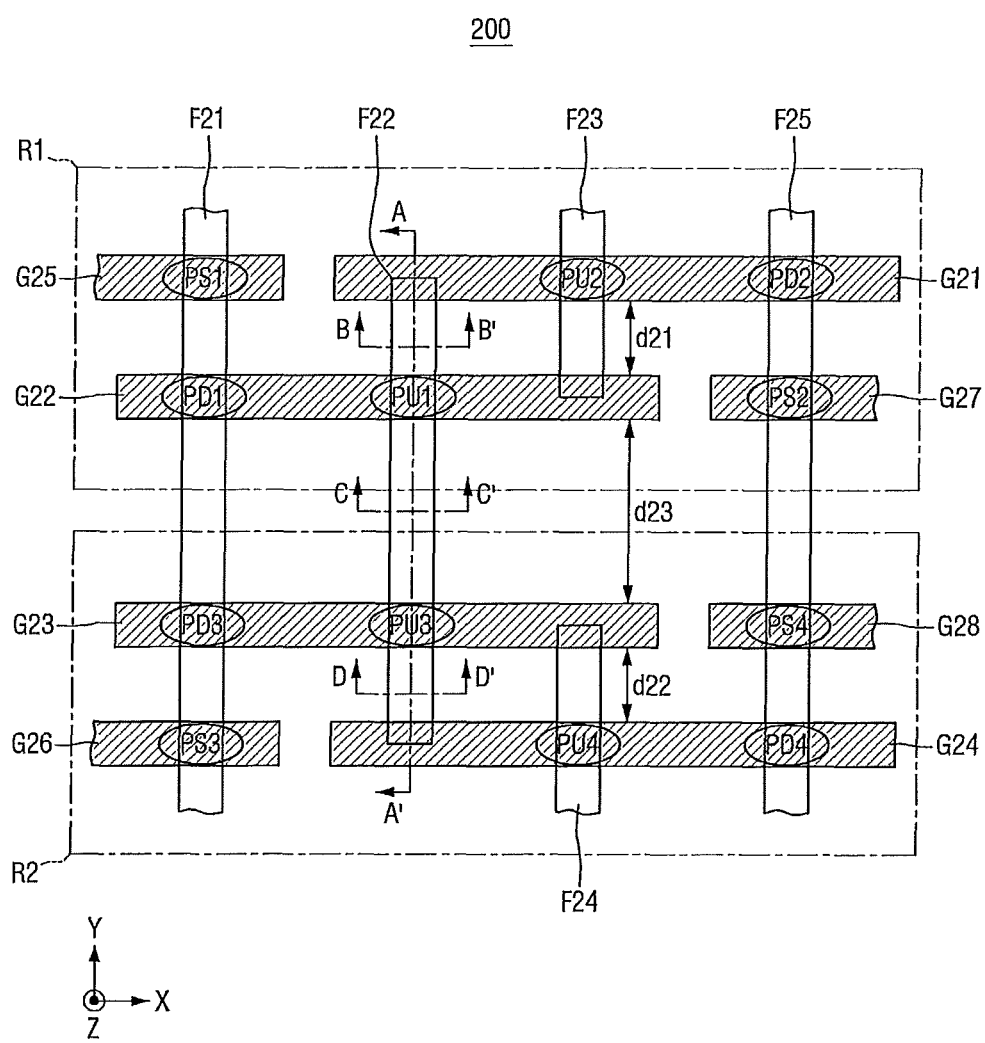
FIG. 5 is a layout view of a semiconductor device according to some embodiments of the present inventive concepts.

FIG. 5 is a layout view of the semiconductor device 200 according to some embodiments of the present inventive concepts. FIG. 6 is a cross-sectional view taken along line A-A' of FIG. 5. FIG. 7 is cross-sectional views taken along lines B-B', C-C', and D-D' of FIG. 5.

Figure 6:
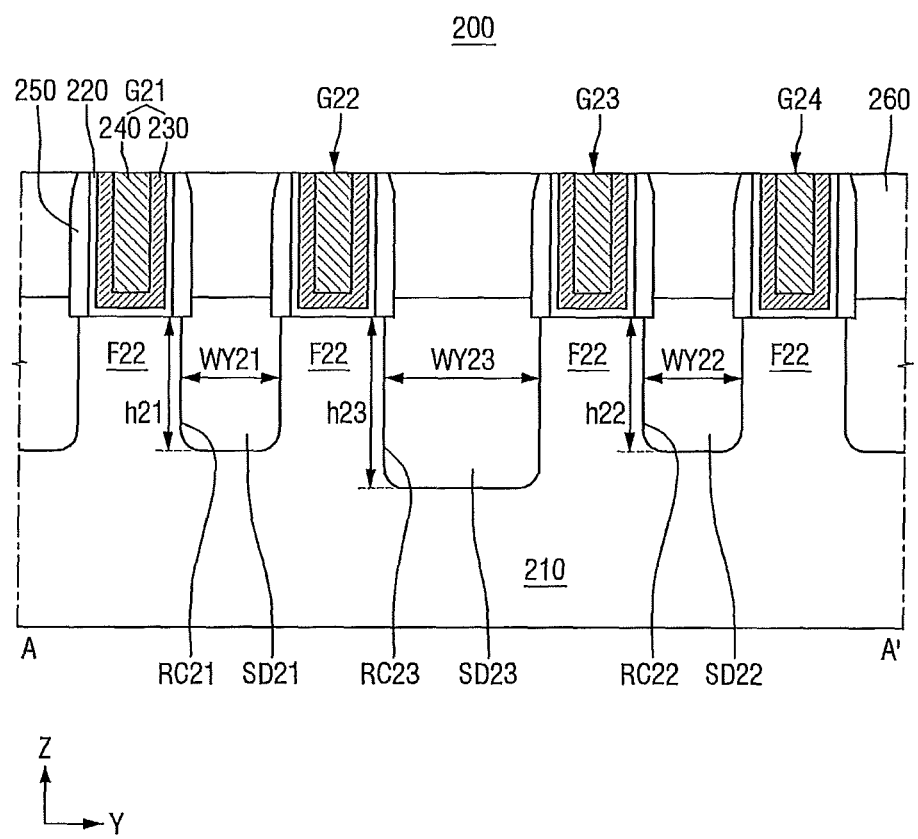
FIG. 6 is a cross-sectional view taken along a line A-A' of FIG. 5.
Figure 7:
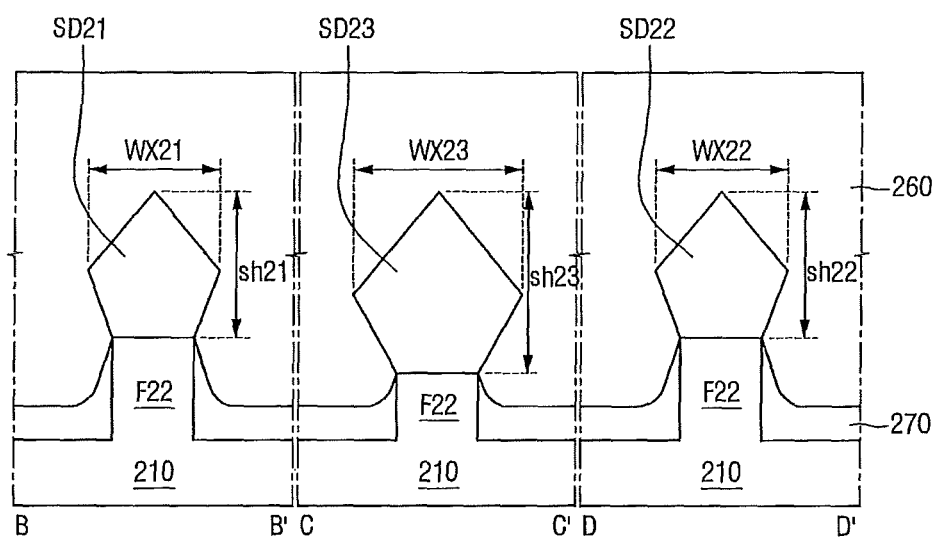
FIG. 7 is cross-sectional views taken along lines B-B', C-C', and D-D' of FIG. 5, respectively.
Figure 7:
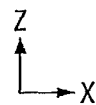

Referring to FIG. 5 through FIG. 7, the semiconductor device 200 may includes a substrate 210, first through eighth gate electrodes G21 through G28, first through fifth fin active patterns F21 through F25, first through third source/drain regions SD21 through SD23, a gate insulating layer 220, gate spacers 250, an interlayer insulating film 260, and a field insulating layer 270.

Like the first through eighth gate electrodes G11 through G18 illustrated in FIG. 3, each of the first through eighth gate electrodes G21 through G28 may include a work function metal 230 and a fill metal 240. The substrate 210, the first through eighth gate electrodes G21 through G28, the first through fifth fin active patterns F21 through F25, the gate insulating layer 220, the gate spacers 250, the interlayer insulating film 260, and the field insulating layer 270 are similar to the first through eighth gate electrodes G11 through G18, the first through fifth fin active patterns F11 through F15, the gate insulating layer 120, the gate spacers 150, the interlayer insulating film 160, and the field insulating layer 170 of FIG. 2 through FIG. 4.

Unlike in the semiconductor device 100 illustrated in FIG. 2, in the semiconductor device 200 illustrated in FIG. 5, a third distance d23 between the second gate electrode G22 and the third gate electrode G23 may be greater than a first distance d21 between the first gate electrode G21 and the second gate electrode G22 and a second distance d22 between the third gate electrode G23 and the fourth gate electrode G24. In some embodiments, the first gate electrode G21 may be spaced apart from, or separated from, both the second gate electrode G22 and the seventh gate electrode G27 by the first distance d21, and the fifth gate electrode G25 may be spaced apart from, or separated from, the second gate electrode G22 by the first distance d21. The second gate electrode G22 may be spaced apart from, or separated from, the third gate electrode G23 by the third distance d23, and the seventh gate electrode G27 may be spaced apart from, or separated from, the eighth gate electrode G28 by the third distance d23. The third gate electrode G23 may be spaced apart from, or separated from, both the sixth gate electrode G26 and the fourth gate electrode G24 by the second distance d22, and the eighth gate electrode G28 may be spaced apart from, or separated from, the fourth gate electrode G24 by the second distance d22.

Therefore, as illustrated in FIG. 6, a third width WY23 in the second direction Y of the third source/drain region SD23, which fills a third recess RC23 may be greater than a first width WY21 in the second direction Y of the first source/drain region SD21, which fills a first recess RC21 and a second width WY22 in the second direction Y of the second source/drain region SD22, which fills a second recess RC22.

In addition, as illustrated in FIG. 7, a sixth width WX23 of the third source/drain region SD23 in a first direction X may be greater than a fourth width WX21 of the first source/drain region SD21 in the first direction X and a fifth width WX22 of the second source/drain region SD22 in the first direction X. The fourth through sixth widths WX21 through WX23 in the first direction X are the largest or outermost widths of the first through third source drain regions SD21 through SD23, respectively, in the first direction X, as the widths of the fourth through sixth widths WX21 through WX23 of the first through third source/drain regions SD21 through SD23, respectively, may vary from a top of the first through third source drain regions SD21 through SD23 to the bottom of the first through third source drain regions SD21 through SD23, respectively. That is, the largest width, or the outermost width, in the first direction X of the first through third source drain regions SD21 through SD23 may be at a middle portion thereof. In some embodiments, the first through third source drain regions SD21 through SD23 may have a pentagon shape.

In addition, similar to the semiconductor device 100 illustrated in FIG. 3, a third depth h23 in the third direction Z of the third recess RC23 from a top of the second fin active pattern F22 to a bottom of the third recess RC23 may be greater than a first depth h21 in the third direction Z of the first recess RC21 from a top of the second fin active pattern F22 to a bottom of the first recess RC21 and a second depth h22 in the third direction Z of the second recess RC22 from a top of the second fin active pattern F22 to a bottom of the second recess RC22.

Accordingly, a third depth sh23 in the third direction Z of the third source/drain region SD23, which fills the third recess RC23 may be greater than a first depth sh21 in the third direction Z of the first source/drain region SD21, which fills the first recess RC21 and a second depth sh22 in the third direction Z of the second source/drain region SD22, which fills the second recess RC22.

A semiconductor device 300 according to some embodiments of the present inventive concepts will now be described with reference to FIG. 8 through FIG. 10. The semiconductor device 300 according to the embodiment of FIG. 8 through FIG. 10 will be described, focusing mainly on differences between the semiconductor device 300 of FIG. 8 through FIG. 10 and the semiconductor device 100 of FIG. 2 through FIG. 4.

Figure 8:
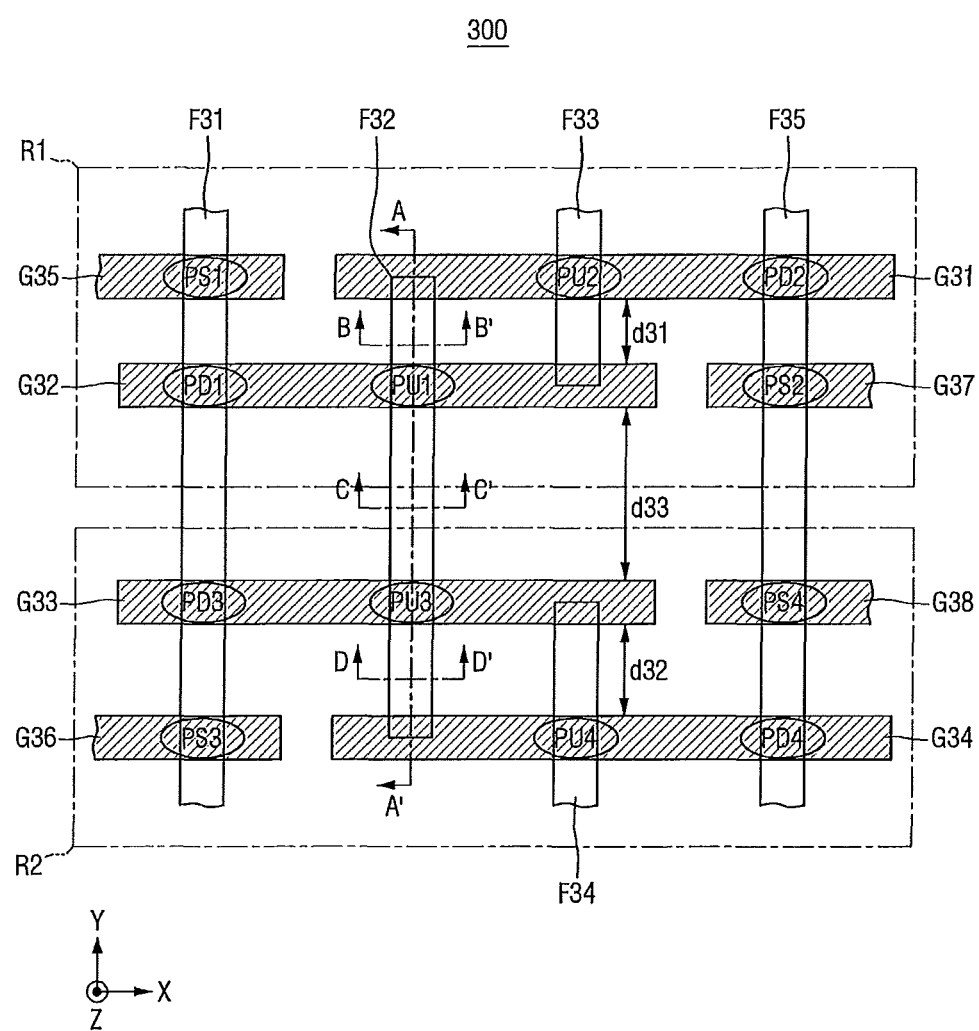
FIG. 8 is a layout view of a semiconductor device according to some embodiments of the present inventive concepts.

FIG. 8 is a layout view of the semiconductor device 300 according to some embodiments of the present inventive concepts. FIG. 9 is a cross-sectional view taken along line A-A' of FIG. 8. FIG. 10 is cross-sectional views taken along lines B-B', C-C', and D-D' of FIG. 8.

Figure 9:
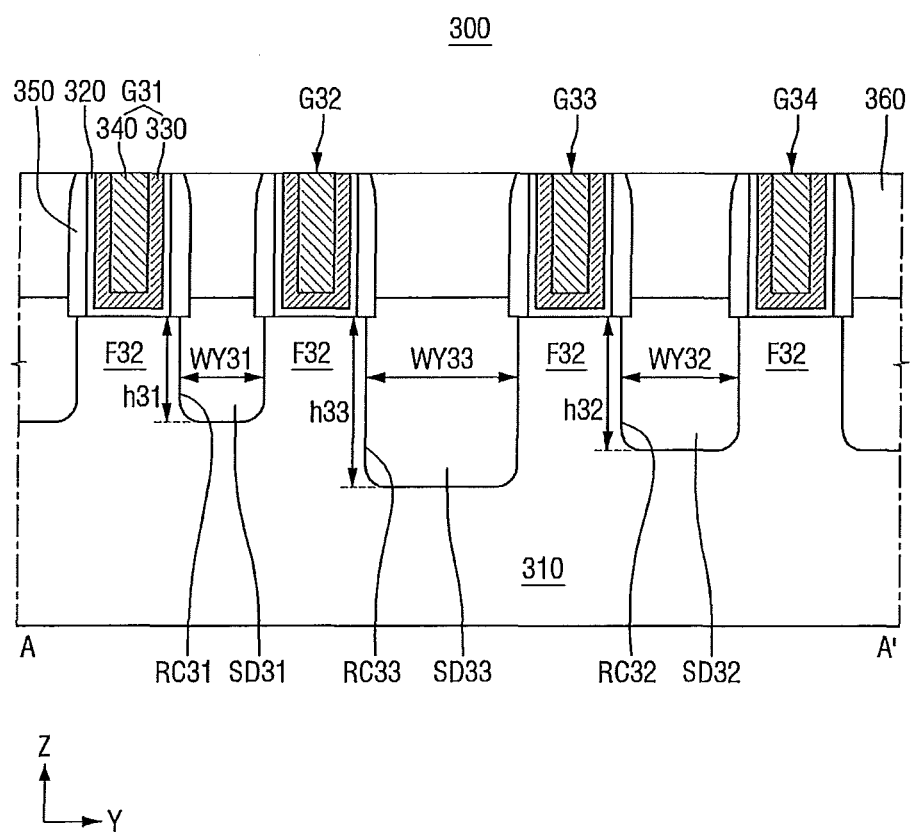
FIG. 9 is a cross-sectional view taken along a line A-A' of FIG. 8.
Figure 10:
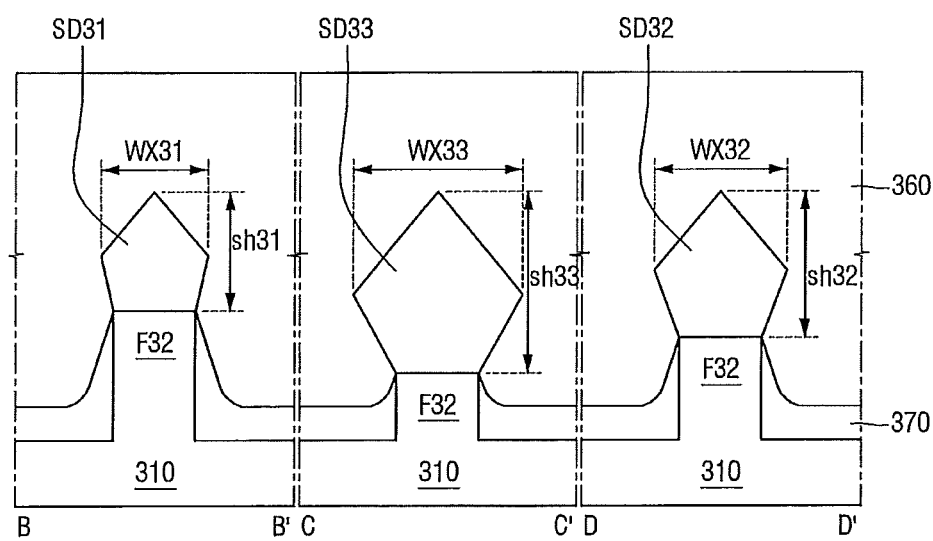
FIG. 10 is cross-sectional views taken along lines B-B', C-C', and D-D' of FIG. 8, respectively.
Figure 10:
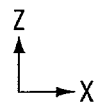

Referring to FIG. 8 through FIG. 10, the semiconductor device 300 may include a substrate 310, first through eighth gate electrodes G31 through G38, first through fifth fin active patterns F31 through F35, first through third source/drain regions SD31 through SD33, a gate insulating layer 320, gate spacers 350, an interlayer insulating film 360, and a field insulating layer 370.

Like the first through eighth gate electrodes G11 through G18 illustrated in FIG. 3, each of the first through eighth gate electrodes G31 through G38 may include a work function metal 330 and a fill metal 340. The substrate 310, the first through eighth gate electrodes G31 through G38, the first through fifth fin active patterns F31 through F35, the gate insulating layer 320, the gate spacers 350, the interlayer insulating film 360, and the field insulating layer 370 are similar to the first through eighth gate electrodes G11 through G18, the first through fifth fin active patterns F11 through F15, the gate insulating layer 120, the gate spacers 150, the interlayer insulating film 160, and the field insulating layer 170 of FIG. 2 through FIG. 4.

Unlike in the semiconductor device 100 illustrated in FIG. 2, in the semiconductor device 300 illustrated in FIG. 8, a third distance d33 between the second gate electrode G32 and the third gate electrode G33 may be greater than a first distance d31 between the first gate electrode G31 and the second gate electrode G32 and a second distance d32 between the third gate electrode G33 and the fourth gate electrode G34. In some embodiments, the first gate electrode G31 may be spaced apart from, or separated from, both the second gate electrode G32 and the seventh gate electrode G37 by the first distance d31, and the fifth gate electrode G35 may be spaced apart from, or separated from, the second gate electrode G32 by the first distance d31. The second gate electrode G32 may be spaced apart from, or separated from, the third gate electrode G33 by the third distance d33, and the seventh gate electrode G37 may be spaced apart from, or separated from, the eighth gate electrode G38 by the third distance d33. The third gate electrode G33 may be spaced apart from, or separated from, both the sixth gate electrode G36 and the fourth gate electrode G34 by the second distance d32, and the eighth gate electrode G38 may be spaced apart from, or separated from, the fourth gate electrode G34 by the second distance d32.

In the embodiment of FIG. 8 through FIG. 10, the second distance d32 between the third gate electrode G33 and the fourth gate electrode G34 may be greater than the first distance d31 between the first gate electrode G31 and the second gate electrode G32.

Therefore, as illustrated in FIG. 9, a third width WY33 in the second direction Y of the third source/drain region SD33, which fills a third recess RC33 may be greater than a first width WY31 in the second direction Y of the first source/drain region SD31, which fills a first recess RC31 and a second width WY32 in the second direction Y of the second source/drain region SD32, which fills a second recess RC32.

In the embodiment of FIG. 8 through FIG. 10, the second width WY32 in the second direction Y of the second source/drain region SD32, which fills the second recess RC32 may be greater than the first width WY31 in the second direction Y of the first source/drain region SD31, which fills the first recess RC31.

In addition, as illustrated in FIG. 10, a sixth width WX33 in the first direction X of the third source/drain region SD33 may be greater than a fourth width WX31 in the first direction X of the first source/drain region SD31 and a fifth width WX32 in the first direction X of the second source/drain region SD32.

In the embodiment of FIG. 8 through FIG. 10, the fifth width WX32 in the first direction X of the second source/drain region SD32 may be greater than the fourth width WX31 in the first direction X of the first source/drain region SD31. The fourth through sixth widths WX31 through WX33 in the first direction X are the largest or outermost widths of the first through third source drain regions SD31 through SD33, respectively, in the first direction X, as the widths of the fourth through sixth widths WX31 through WX33 of the first through third source/drain regions SD31 through SD33, respectively, may vary from a top of the first through third source drain regions SD31 through SD33 to the bottom of the first through third source drain regions SD31 through SD33, respectively. That is, the largest width, or the outermost width, in the first direction X of the first through third source drain regions SD31 through SD33 may be at a middle portion thereof. In some embodiments, the first through third source drain regions SD31 through SD33 may have a pentagon shape.

In addition, similar to the semiconductor device 100 illustrated in FIG. 3, a third depth h33 in the third direction Z of the third recess RC33 from a top of the second fin active pattern F32 to a bottom of the third recess RC33 formed at a middle point between the first region R1 and the second region R2 of the substrate 310 may be greater than a first depth h31 in the third direction Z of the first recess RC31 from a top of the second fin active pattern F32 to a bottom of the first recess RC31 and a second depth h32 in the third direction Z of the second recess RC32 from a top of the second fin active pattern F32 to a bottom of the second recess RC32.

Accordingly, a third depth sh33 in the third direction Z of the third source/drain region SD33, which fills the third recess RC33 may be greater than a first depth sh31 in the third direction Z of the first source/drain region SD31, which fills the first recess RC31 and a second depth sh32 in the third direction Z of the second source/drain region SD32, which fills the second recess RC32.

In the embodiment of FIG. 8 through FIG. 10, the second depth h32 in the third direction Z of the second recess RC32 may be greater than the first depth h31 in the third direction Z of the first recess RC31. Accordingly, the second depth sh32 in the third direction Z of the second source/drain region SD32, which fills the second recess RC32 may be greater than the first depth sh31 in the third direction Z of the first source/drain region SD31, which fills the first recess RC31.

A semiconductor device 400 according to some embodiments of the present inventive concepts will now be described with reference to FIG. 11 and FIG. 12. The semiconductor device 400 according to embodiment of FIG. 11 and FIG. 12 will be described, focusing mainly on differences between the semiconductor device 400 of FIG. 11 and FIG. 12 and the semiconductor device 100 of FIG. 2 through FIG. 4.

Figure 11:
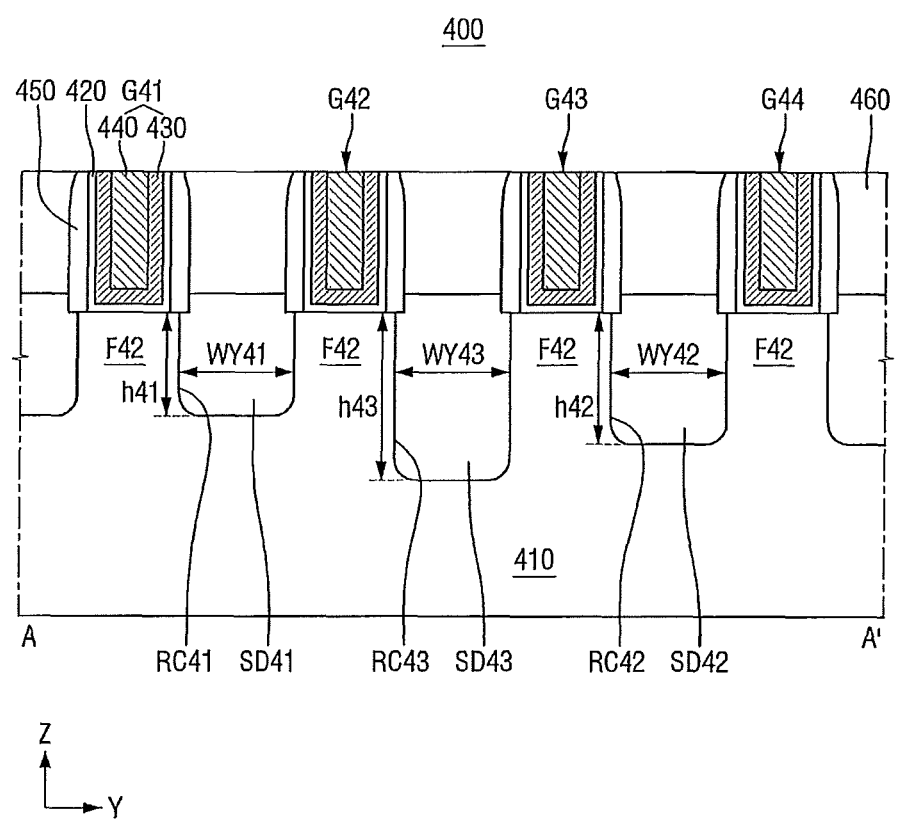
FIG. 11 and FIG. 12 are cross-sectional views of a semiconductor device according to some embodiments of the present inventive concepts.
Figure 12:
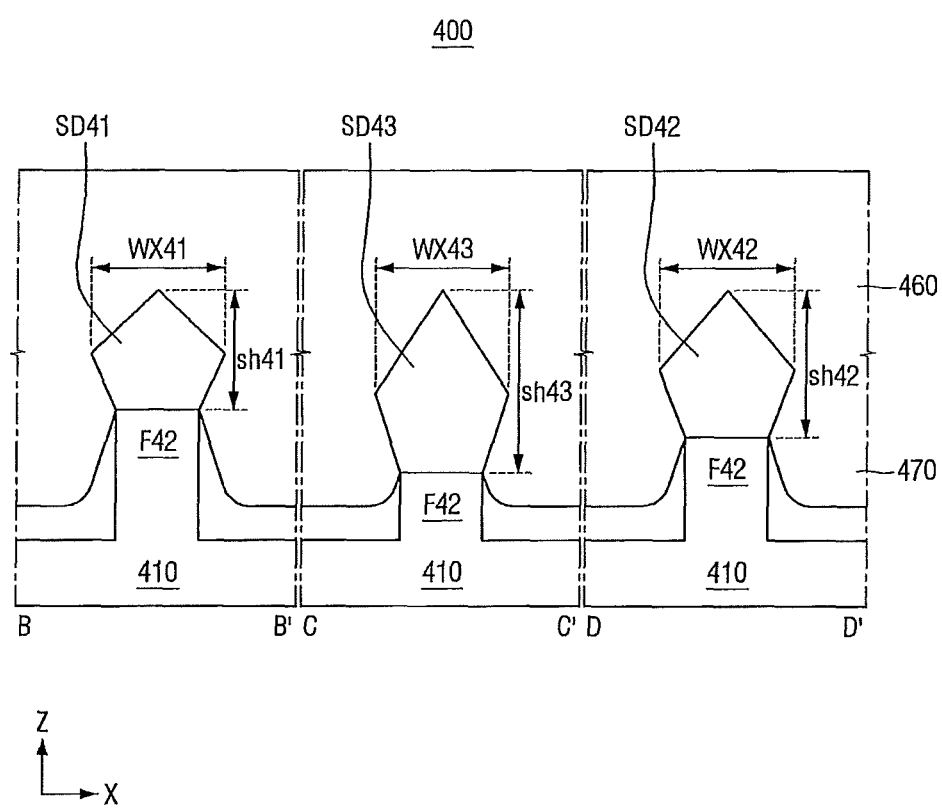

FIG. 11 and FIG. 12 are cross-sectional views of the semiconductor device 400 according to some embodiments of the present inventive concepts. FIG. 3 is a cross-sectional view taken along a line A-A' of FIG. 2. FIG. 4 is cross-sectional views taken along lines B-B', C-C', and D-D' of FIG. 2, respectively.

Referring to FIG. 11 and FIG. 12, the semiconductor device 400 may include a substrate 410, first through fourth gate electrodes G41 through G44, a second fin active pattern F42, first through third source/drain regions SD41 through SD43, a gate insulating layer 420, gate spacers 450, an interlayer insulating film 460, and a field insulating layer 470.

Like the first through eighth gate electrodes G11 through G18 illustrated in FIG. 3, each of the first through fourth gate electrodes G41 through G44 may include a work function metal 430 and a fill metal 440. The substrate 410, the first through fourth gate electrodes G41 through G44, the second fin active pattern F42, the gate insulating layer 420, the gate spacers 450, the interlayer insulating film 460, and the field insulating layer 470 are similar to the first through eighth gate electrodes G11 through G18, the first through fifth fin active patterns F11 through F15, the gate insulating layer 120, the gate spacers 150, the interlayer insulating film 160, and the field insulating layer 170 of FIG. 2 through FIG. 4.

As in the semiconductor device 100 illustrated in FIG. 2, in the semiconductor device 400 illustrated in FIG. 11, a first width WY41 in the second direction Y of the first source/drain region SD41, which fills a first recess RC41, a second width WY42 in the second direction Y of the second source/drain region SD42, which fills a second recess RC42, and a third width WY43 in the second direction Y of the third source/drain region SD43, which fills a third recess RC43 may be equal to each other.

In the embodiment of FIG. 11 and FIG. 12, as illustrated in FIG. 12, a fourth width WX41 in the first direction X of the first source/drain region SD41, a fifth width WX42 in the first direction X of the second source/drain region SD42, and a sixth width WX43 in the first direction X of the third source/drain region SD43 may be equal to each other.

In addition, a third depth h43 in the third direction Z of the third recess RC43 from a top of the second fin active pattern F42 to a bottom of the third recess RC43 may be greater than a first depth h41 in the third direction Z of the first recess RC41 from a top of the second fin active pattern F42 to a bottom of the first recess RC4 1 and a second depth h42 in the third direction Z of the second recess RC42 from a top of the second fin active pattern F42 to a bottom of the second recess RC42.

Accordingly, a third depth sh43 in the third direction Z of the third source/drain region SD43, which fills the third recess RC43 may be greater than a first depth sh41 in the third direction Z of the first source/drain region SD41, which fills the first recess RC41 and a second depth sh42 in the third direction Z of the second source/drain region SD42, which fills the second recess RC42.

However, unlike in the semiconductor device 100 illustrated in FIG. 3, in the semiconductor device 400 illustrated in FIG. 11, the second depth h42 in the third direction Z of the second recess RC42 may be greater than the first depth h41 in the third direction Z of the first recess RC41. Accordingly, the second depth sh42 in the third direction Z of the second source/drain region SD42, which fills the second recess RC42 may be greater than the first depth sh41 in the third direction Z of the first source/drain region SD41, which fills the first recess RC41.

A semiconductor device 500 according to some embodiments of the present inventive concepts will now be described with reference to FIG. 13. The semiconductor device 500 according to the embodiment of FIG. 13 will be described, focusing mainly on differences between the semiconductor device 500 of FIG. 13 and the semiconductor device 100 of FIG. 2 through FIG. 4.

Figure 13:
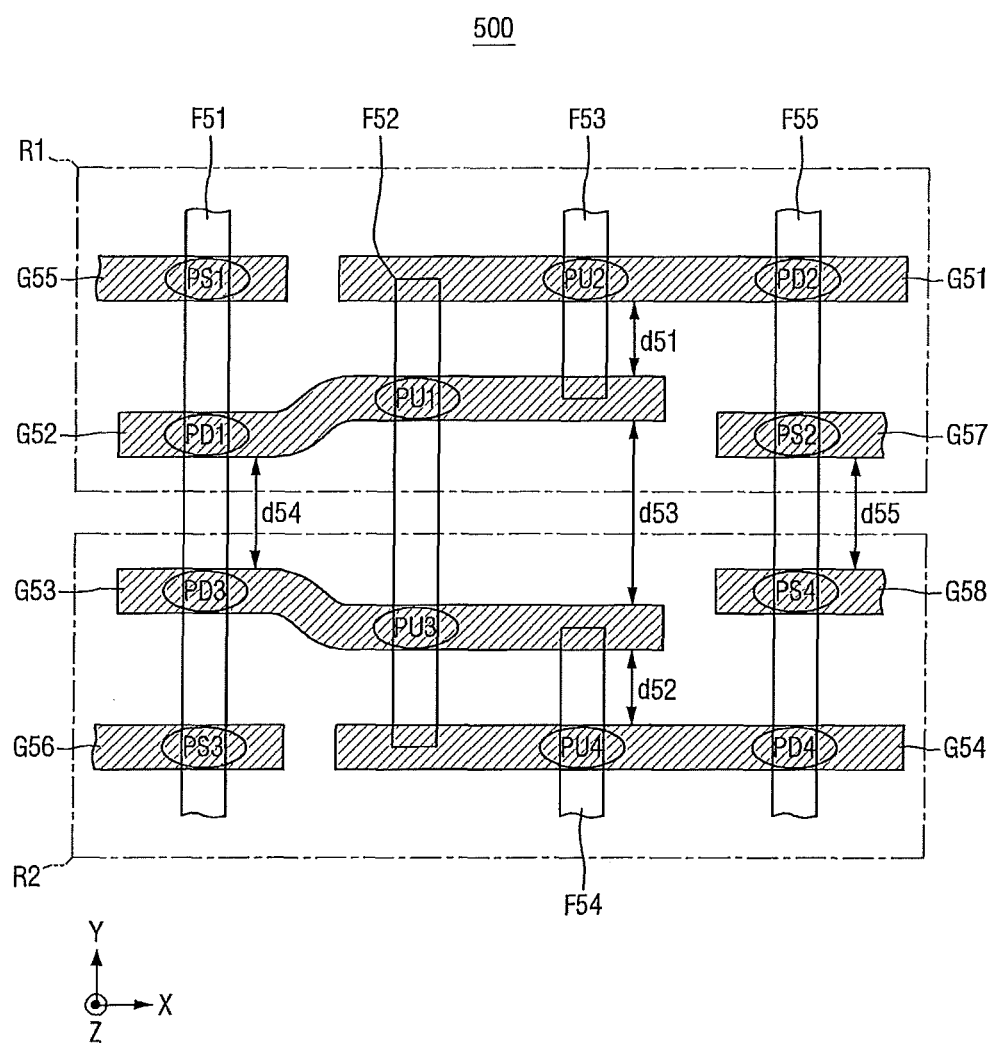
FIG. 13 is a layout view of a semiconductor device according to some embodiments of the present inventive concepts.

FIG. 13 is a layout view of the semiconductor device 500 according to some embodiments of the present inventive concepts.

Referring to FIG. 13, the semiconductor device 500 may include first through eighth gate electrodes G51 through G58 and first through fifth fin active patterns F51 through F55.

The semiconductor device 500 illustrated in FIG. 13 differs from the semiconductor device 100 illustrated in FIG. 2 in that the second gate electrode G52 and the third gate electrode G53 are bent.

Specifically, a first distance d51 between a first portion of the second gate electrode G52 and the first gate electrode G51 may be smaller than a distance between a second portion of the second gate electrode G52 and the fifth gate electrode G55. In addition, the second gate electrode G52 may include a third portion which connects the first portion of the second gate electrode G52 facing the first gate electrode G51 and the second portion of the second gate electrode G52 facing the fifth gate electrode G55 and has an acute angle to a first direction X. The distance between the second portion of the second gate electrode G52 and the fifth gate electrode G55 may be equal to a distance between the seventh gate electrode G57 and the first gate electrode G51.

In addition, a second distance d52 between a first portion of the third gate electrode G53 and the fourth gate electrode G54 may be smaller than a distance between a second portion of the third gate electrode G53 and the sixth gate electrode G56. In addition, the third gate electrode G53 may include a third portion which connects the first portion of the third gate electrode G53 facing the fourth gate electrode G54 and the second portion of the third gate electrode G53 facing the sixth gate electrode G56 and has an acute angle to the first direction X. The distance between the second portion of the third gate electrode G53 and the sixth gate electrode G56 may be equal to a distance between the eighth gate electrode G58 and the fourth gate electrode G54.

Accordingly, a fourth distance d54 between the second portion of the second gate electrode G52 and the second portion of the third gate electrode G53 which intersect the first fin active pattern F51 may be smaller than a third distance d53 between the first portion of the second gate electrode G52 and the first portion of the third gate electrode G53 which intersect the second fin active pattern F52.

In addition, a fifth distance d55 between the seventh gate electrode G57 and the eighth gate electrode G58 which intersect the fifth fin active pattern F55 may be smaller than the third distance d53 between the first portion of the second gate electrode G52 and the first portion of the third gate electrode G53 which intersect the second fin active pattern F52.

In the embodiment of FIG. 13, the fifth distance d55 between the seventh gate electrode G57 and the eighth gate electrode G58 which intersect the fifth fin active pattern F55 may be equal to the fourth distance d54 between the second portion of the second gate electrode G52 and the second portion of the third gate electrode G53 which intersect the first fin active pattern F51.

In addition, the third distance d53 between the first portion of the second gate electrode G52 and the first portion of the third gate electrode G53 which intersect the second fin active pattern F52 may be greater than the first distance d51 between the first gate electrode G51 and the first portion of the second gate electrode G52 which intersect the second fin active pattern F52 and the second distance d52 between the first portion of the third gate electrode G53 and the fourth gate electrode G54 which intersect the second fin active pattern F52.

A semiconductor device 600 according to some embodiments of the present inventive concepts will now be described with reference to FIG. 14. The semiconductor device 600 according to the embodiment of FIG. 14 will be described, focusing mainly on differences between the semiconductor device 600 of FIG. 14 and the semiconductor device 500 of FIG. 13.

Figure 14:
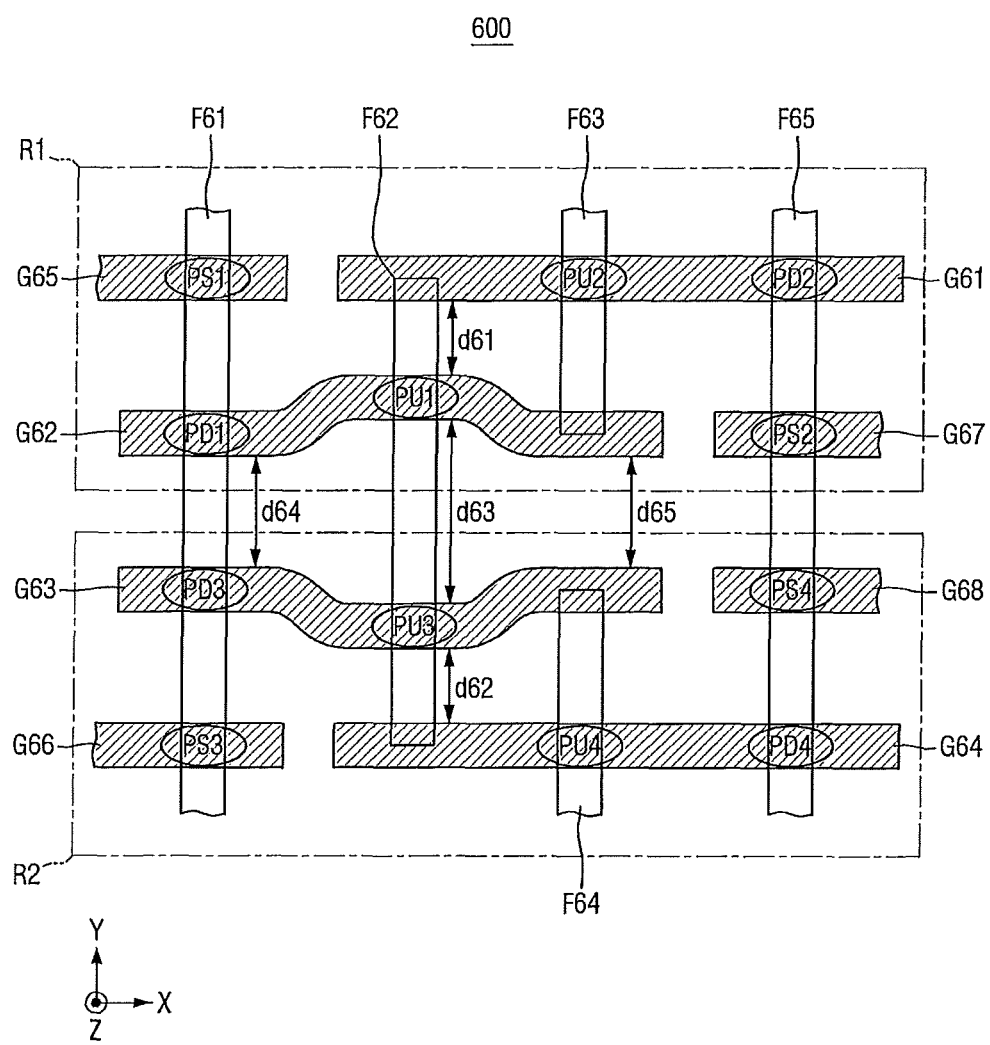
FIG. 14 is a layout view of a semiconductor device according to some embodiments of the present inventive concepts.

FIG. 14 is a layout view of the semiconductor device 600 according to some embodiments of the present inventive concepts.

Referring to FIG. 14, the semiconductor device 600 may include first through eighth gate electrodes G61 through G68 and first through fifth fin active patterns F61 through F65.

The semiconductor device 600 illustrated in FIG. 14 differs from the semiconductor device 500 illustrated in FIG. 13 in that the second gate electrode G52 and the third gate electrode G53 are bent twice.

Specifically, the second gate electrode G62 may include a fifth portion which connects a first portion of the second gate electrode G62 intersecting the second fin active pattern F62 and a fourth portion of the second gate electrode G62 intersecting the third fin active pattern F63 and has an acute angle to a first direction X. The second gate electrode G62 may include a third portion which connects the first portion of the second gate electrode G62 and a second portion of the second gate electrode G62 intersecting the first fin active pattern F61. In addition, the third gate electrode G63 may include a fifth portion which connects a first portion of the third gate electrode G63 intersecting the second fin active pattern F62 and a fourth portion of the third gate electrode G63 intersecting the fourth fin active pattern F64 and has an acute angle to the first direction X. The third gate electrode G63 may include a third portion which connects the first portion of the third gate electrode G63 and a second portion of the third gate electrode G63 intersecting the first fin active pattern F61. The distance between the second portion of the second gate electrode G62 and the fifth gate electrode G65 may be equal to the distance between the fourth portion of the second gate electrode G62 and the first gate electrode G61 and the distance between the seventh gate electrode G67 and the first gate electrode G61. The distance between the second portion of the third gate electrode G63 and the sixth gate electrode G66 may be equal to the distance between the fourth portion of the third gate electrode G63 and the fourth gate electrode G64 and the distance between the eighth gate electrode G68 and the fourth gate electrode G64.

In addition, a distance d61 between the first gate electrode G61 and the first portion second gate electrode G62 which intersect the second fin active pattern F62 and a distance d62 between the first portion of the third gate electrode G63 and the fourth gate electrode G64 which intersect the second fin active pattern F62 may be smaller than a distance d63 between the first portion of second gate electrode G62 and the first portion of the third gate electrode G63 which intersect the second fin active pattern F62.

In addition, the distance d63 between the first portion of the second gate electrode G62 and the first portion of the third gate electrode G63 which intersect the second fin active pattern F62 may be greater than a distance d64 between the second portion of the second gate electrode G62 and the second portion of the third gate electrode G63 which intersect the first fin active pattern F61.

However, unlike in the semiconductor device 500 illustrated in FIG. 13, in the semiconductor device 600, a distance d65 between the fourth portion of the second gate electrode G62 intersecting the third fin active pattern F63 and the fourth portion of the third gate electrode G63 intersecting the fourth fin active pattern F64 may be smaller than the distance d63 between the first portion of the second gate electrode G62 and the first portion of the third gate electrode G63 which intersect the second fin active pattern F62.

In the embodiment of FIG. 14, the distance d64 between the second portion of the second gate electrode G62 and the second portion of the third gate electrode G63 which intersect the first fin active pattern F61 may be equal to the distance d65 between the fourth portion of the second gate electrode G62 intersecting the third fin active pattern F63 and the fourth portion of the third gate electrode G63 intersecting the fourth fin active pattern F64.

A semiconductor device 700 according to some embodiments of the present inventive concepts will now be described with reference to FIG. 15.

Figure 15:
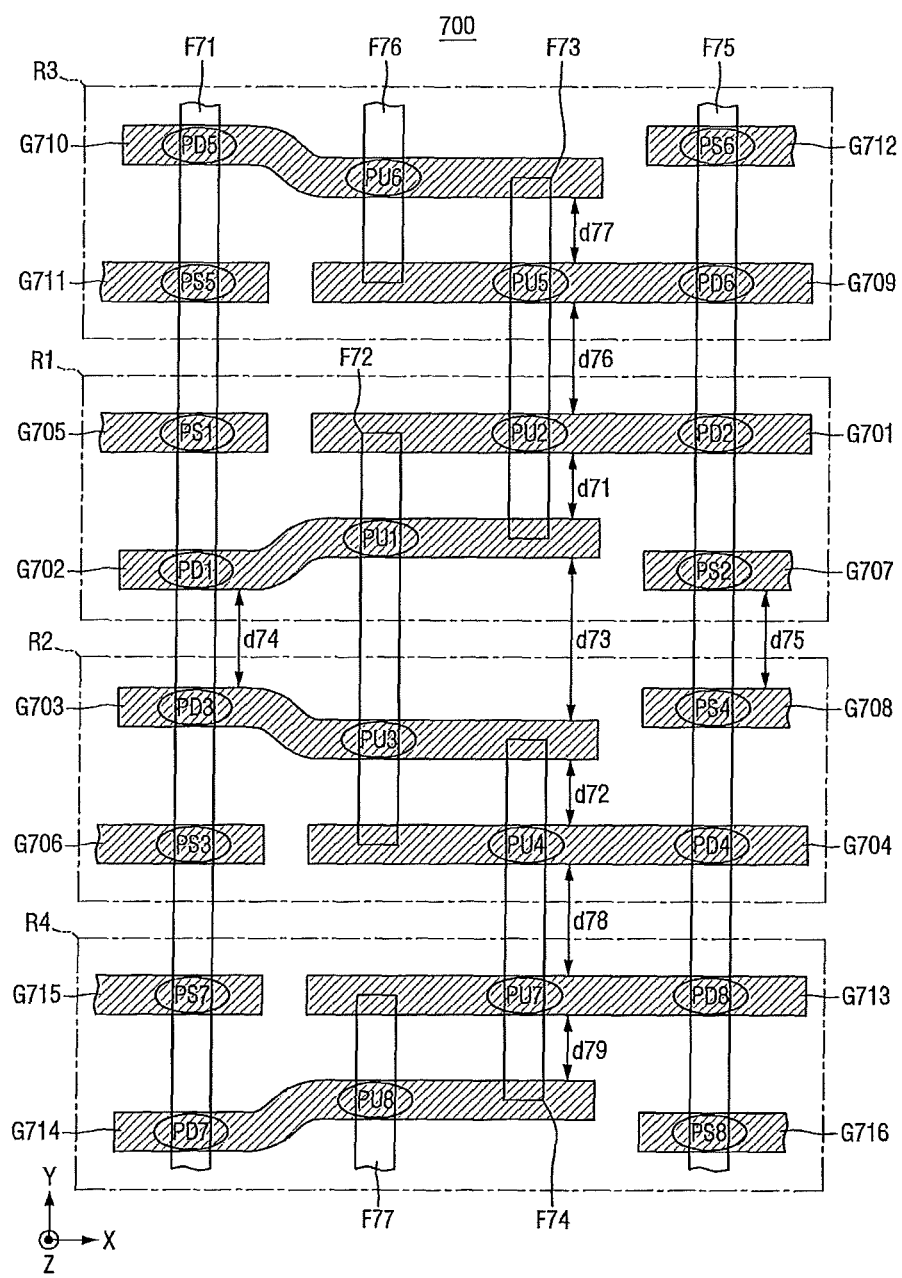
FIG. 15 is a layout view of a semiconductor device according to some embodiments of the present inventive concepts.

FIG. 15 is a layout view of the semiconductor device 700 according to some embodiments of the present inventive concepts. The semiconductor device 700 according to the embodiment of FIG. 15 will be described, focusing mainly on differences between the semiconductor device 700 of FIG. 15 and the semiconductor device 500 of FIG. 13.

Referring to FIG. 15, the semiconductor device 700 may include first through sixteenth gate electrodes G701 through G716 and first through seventh fin active patterns F71 through F77.

The semiconductor device 700 illustrated in FIG. 15 differs from the semiconductor device 500 illustrated in FIG. 13 in that a substrate includes a first region R1, a second region R2 adjacent to the first region R1, a third region R3 adjacent to the first region R1 so as to be opposite to the region R2, and a fourth region R4 adjacent to the second region R2 so as to be opposite to the first region R1. That is, the first region R1 is between the third region R3 and the second region R2 and the second region R2 is between the first region R1 and the fourth region R4.

The first through fourth regions R1 through R4 may include, for example, different SRAM elements. In the embodiment of FIG. 15, a boundary region between every two adjacent ones of the first through fourth regions R1 through R4 may be a middle point between the different SRAM elements.

The first and second regions R1 and R2 may be similar to regions R1 and R2 of FIG. 13. That is, first through eighth gate electrodes G701 through G708 may correspond to first through eighth gate electrodes G51 through G58 of FIG. 13. The ninth through twelfth gate electrodes G709 through G712 disposed in the third region R3 may be arranged to correspond to the first through fourth gate electrodes G701 through G704 disposed in the first region R1, and the thirteenth through sixteenth gate electrodes G713 through G716 disposed in the fourth region R4 may be arranged to correspond to the fifth through eighth gate electrodes G705 through G708 disposed in the second region R2. That is, the ninth through twelfth gate electrodes G709 through G712 of the third region R3 may be arranged symmetrically with the first, second, fifth and seventh gate electrodes G701, G702, G705 and G707 of the first region R1, the first, second, fifth and seventh gate electrodes G701, G702, G705 and G707, respectively, of the first region R1 may be arranged symmetrically with the third, fourth, sixth and eighth gate electrodes G703, G704, G706 and G708, respectively, of the second region, and the third, fourth, sixth and eighth gate electrodes G703, G704, G706 and G708, respectively, of the second region may be arranged symmetrically with the thirteenth through sixteenth gate electrodes G713 through G716 of the fourth region R4.

In the embodiment of FIG. 15, the first fin active pattern F71 and the eleventh gate electrode G711 may form a fifth pass gate transistor PS5. The fifth fin active pattern F75 and the twelfth gate electrode G712 may form a sixth pass gate transistor PS6. The first fin active pattern F71 and the fifteenth gate electrode G715 may form a seventh pass gate transistor PS7. The fifth fin active pattern F75 and the sixteenth gate electrode G716 may form an eighth pass gate transistor PS8.

The first fin active pattern F71 and the tenth gate electrode G710 may form a fifth pull-down transistor PD5. The fifth fin active pattern F75 and the ninth gate electrode G709 may form a sixth pull-down transistor PD6. The first fin active pattern F71 and the fourteenth gate electrode G714 may form a seventh pull down transistor PD7. The fifth fin active pattern F75 and the thirteenth gate electrode G713 may form an eighth pull-down transistor PD8.

The third fin active pattern F73 and the ninth gate electrode G709 may form a fifth pull-up transistor PU5. The sixth fin active pattern F76 and the tenth gate electrode G710 may form a sixth pull-up transistor PU6. The fourth fin active pattern F74 and the thirteenth gate electrode G713 may form a seventh pull-up transistor PU7. The seventh fin active pattern F77 and the fourteenth gate electrode G714 may form an eighth pull-up transistor PU8.

A third distance d73 between a first portion of the second gate electrode G702 and a first portion of the third gate electrode G703 which intersect the second fin active pattern F72 may be greater than a first distance d71 between the first gate electrode G701 and the first portion of the second gate electrode G702 which intersect the third fin active pattern F73 and a second distance d72 between the first portion of the third gate electrode G703 and the fourth gate electrode G704 which intersect the fourth fin active pattern F74.

In addition, the third distance d73 between the first portion of the second gate electrode G702 and the first portion of the third gate electrode G703 which intersect the second fin active pattern F72 may be greater than a fourth distance d74 between a second portion of the second gate electrode G702 and a second portion of the third gate electrode G703 which intersect the first fin active pattern F71 and a fifth distance d75 between the seventh gate electrode G707 and the eighth gate electrode G708 which intersect the fifth fin active pattern F75. The fourth distance d74 between a second portion of the second gate electrode G702 and a second portion of the third gate electrode G703 may be equal to the fifth distance d75 between the seventh gate electrode G707 and the eighth gate electrode G708.

In addition, a sixth distance d76 between the first gate electrode G701 in the first region R1 and the ninth gate electrode G709 in the third region R3 which intersect the third fin active pattern F73 may be greater than the first distance d71 between the first gate electrode G701 and the first portion of the second gate electrode G702 which intersect the third fin active pattern F73 and a seventh distance d77 between the ninth gate electrode G709 and a first portion of the tenth gate electrode G710 which intersect the third fin active pattern F73. The sixth distance d76 between the first gate electrode G701 in the first region R1 and the ninth gate electrode G709 may be equal to the distance between the fifth gate electrode G705 of the first region R1 and the eleventh gate electrode G711 of the third region R3. The seventh distance d77 between the ninth gate electrode G709 and the first portion of the tenth gate electrode G710 may be less than a distance between the eleventh gate electrode G711 and a second portion of the tenth gate electrode G10.

In addition, an eighth distance d78 between the fourth gate electrode G704 of the second region R2 and the thirteenth gate electrode G713 of the fourth region R4 which intersect the fourth fin active pattern F74 may be greater than the second distance d72 between the first portion of the third gate electrode G703 and the fourth gate electrode G704 which intersect the fourth fin active pattern F74 and a ninth distance d79 between the thirteenth gate electrode G713 and a first portion of the fourteenth gate electrode G714 which intersect the fourth fin active pattern F74. The eighth distance d78 between the fourth gate electrode G704 in the second region R2 and the thirteenth gate electrode G713 of the fourth region R4 may be equal to the distance between the sixth gate electrode G706 of the second region R2 and the fifteenth gate electrode G715 of the fourth region R4. The ninth distance d79 between the thirteenth gate electrode G713 and the first portion of the fourteenth gate electrode G714 may be less than a distance between the fifteenth gate electrode G715 and a second portion of the fourteenth gate electrode G14.

A semiconductor device 800 according to some embodiments of the present inventive concepts will now be described with reference to FIG. 16. The semiconductor device 800 according to the embodiment of FIG. 16 will be described, focusing mainly on differences between the semiconductor device 800 of FIG. 16 and the semiconductor device 100 of FIG. 3.

Figure 16:
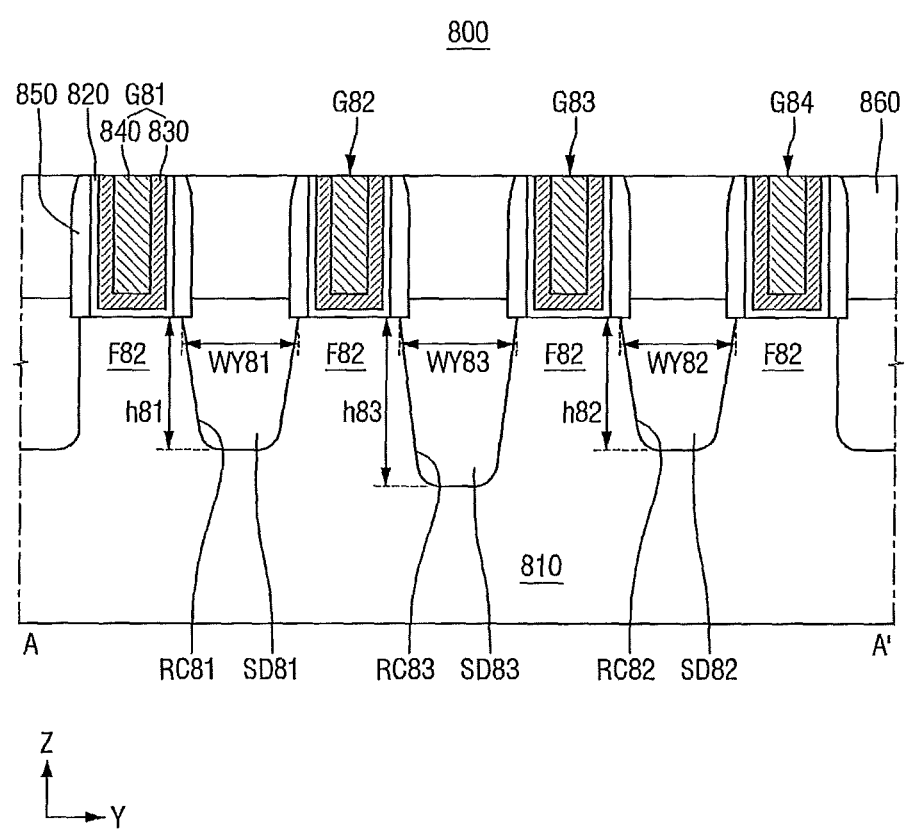
FIG. 16 is a cross-sectional view of a semiconductor device according to some embodiments of the present inventive concepts.

FIG. 16 is a cross-sectional view of the semiconductor device 800 according to some embodiments of the present inventive concepts. FIG. 16 is a cross-sectional view taken along a line A-A' of FIG. 2.

Referring to FIG. 16, the semiconductor device 800 may include a substrate 810, first through fourth gate electrodes G81 through G84, a second fin active pattern F82, first through third source/drain regions SD81 through SD83, a gate insulating layer 820, gate spacers 850, and an interlayer insulating film 860.

Like the first through eighth gate electrodes G11 through G18 illustrated in FIG. 3, each of the first through fourth gate electrodes G81 through G84 may include a work function metal 830 and a fill metal 840. The substrate 810, the first through fourth gate electrodes G81 through G84, the second fin active pattern F82, the gate insulating layer 820, the gate spacers 850 and the interlayer insulating film 860 are similar to the first through fourth gate electrodes G11 through G14, the second fin active pattern F12, the gate insulating layer 120, the gate spacers 150 and the interlayer insulating film 160 of FIG. 2 through FIG. 4.

As in the semiconductor device 100 illustrated in FIG. 3, in the semiconductor device 800 illustrated in FIG. 16, a first width WY81 in the second direction Y of the first source/drain region SD81, which fills a first recess RC81, a second width WY82 in the second direction Y of the second source/drain region SD82, which fills a second recess RC82, and a third width WY83 in the second direction Y of the third source/drain region SD83, which fills a third recess RC83 may be equal to each other.

In addition, a third depth h83 in the third direction Z of the third recess RC83 from a top of the second fin active pattern F82 to a bottom of the third recess RC83 may be greater than a first depth h81 in the third direction Z of the first recess RC81 from a top of the second fin active pattern F82 to a bottom of the first recess RC8 1and a second depth h82 in the third direction Z of the second recess RC82 from a top of the second fin active pattern F82 to a bottom of the second recess RC82.

However, the semiconductor device 800 illustrated in FIG. 16, unlike the semiconductor device 100 of FIG. 3, may have a slope profile in which the first through third recesses RC81 through RC83 become narrower as the distance from the top of the second fin active pattern F82 to the substrate 810 is reduced. That is, a width of each of the first through third recesses RC81 through RC83 at a bottom of each of the first through third recesses RC81 through RC83 is smaller than at a top of each of the first through third recesses RC81 through RC83, respectively.

A semiconductor device 900 according to some embodiments of the present inventive concepts will now be described with reference to FIG. 17. The semiconductor device 900 according to the embodiment of FIG. 17 will be described, focusing mainly on differences between the semiconductor device 900 of FIG. 17 and the semiconductor device 100 of FIG. 3.

Figure 17:
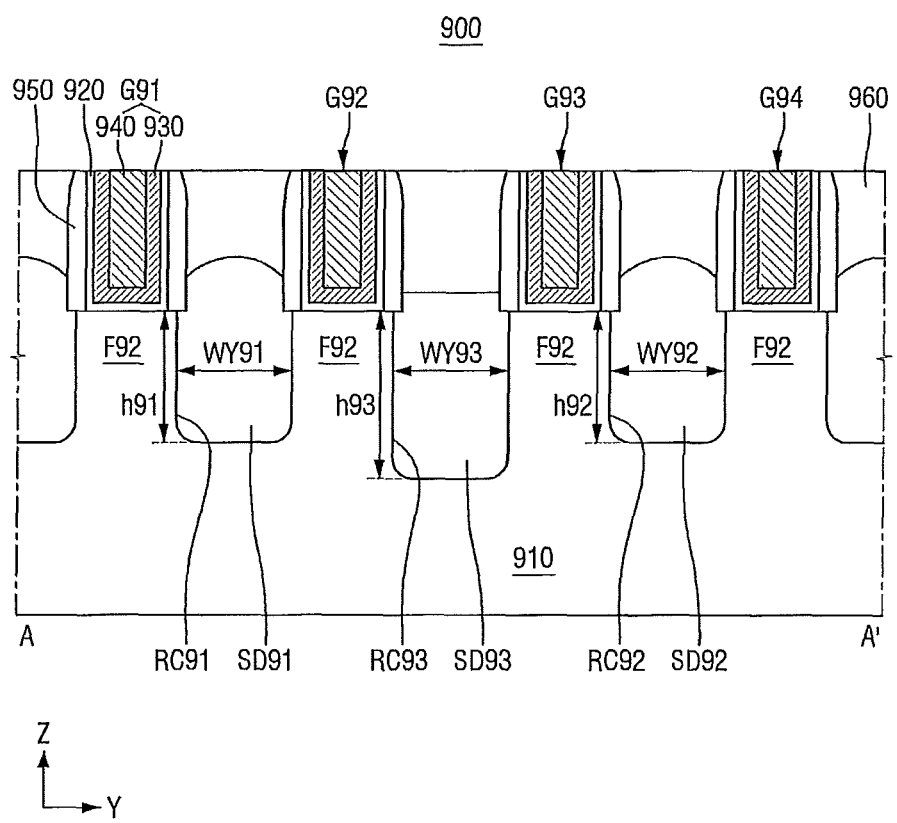
FIG. 17 is a cross-sectional view of a semiconductor device according to some embodiments of the present inventive concepts.

FIG. 17 is a cross-sectional view of the semiconductor device 900 according to some embodiments of the present inventive concepts. FIG. 17 is a cross-sectional view taken along a line A-A' of FIG. 2.

Referring to FIG. 17, the semiconductor device 900 may include a substrate 910, first through fourth gate electrodes G91 through G94, a second fin active pattern F92, first through third source/drain regions SD91 through SD93, a gate insulating layer 920, gate spacers 950, and an interlayer insulating film 960.

Like the first through eighth gate electrodes G11 through G18 illustrated in FIG. 3, each of the first through fourth gate electrodes G91 through G94 may include a work function metal 930 and a fill metal 940. The substrate 910, the first through fourth gate electrodes G91 through G94, the second fin active pattern F92, the gate insulating layer 920, the gate spacers 950 and the interlayer insulating film 960 are similar to the first through fourth gate electrodes G11 through G14, the second fin active pattern F12, the gate insulating layer 120, the gate spacers 150 and the interlayer insulating film 160 of FIG. 2 through FIG. 4.

As in the semiconductor device 100 illustrated in FIG. 3, in the semiconductor device 900 illustrated in FIG. 17, a first width WY91 in the second direction Y of the first source/drain region SD91, which fills a first recess RC91, a second width WY92 in the second direction Y of the second source/drain region SD92, which fills a second recess RC92, and a third width WY93 in the second direction Y of the third source/drain region SD93, which fills a third recess RC93 may be equal to each other.

In addition, a third depth h93 in the third direction Z of the third recess RC93 from a top of the second fin active pattern F92 to a bottom of the third recess RC93 may be greater than a first depth h91 in the third direction Z of the first recess RC91 from a top of the second fin active pattern F92 to a bottom of the first recess RC91 and a second depth h92 in the third direction Z of the second recess RC92 from a top of the second fin active pattern F92 to a bottom of the second recess RC92.

However, in the semiconductor device 900 illustrated in FIG. 17, unlike the semiconductor device 100 of FIG. 3, an upper surface of the first source/drain region SD91 and an upper surface of the second source/drain region SD92 may be convex. The upper surface of the third source/drain region SD93 may be substantially planar, that is flat. The upper surfaces of the first and second source/drain regions SD91 and SD92 may extend above the upper surface of the third source/drain region SD93 in the third direction Z.

A semiconductor device 1000 according to some embodiments of the present inventive concepts will now be described with reference to FIG. 18. The semiconductor device 1000 according to the embodiment of FIG. 18 will be described, focusing mainly on differences between the semiconductor device 1000 of FIG. 18 and the semiconductor device 100 of FIG. 3.

Figure 18:
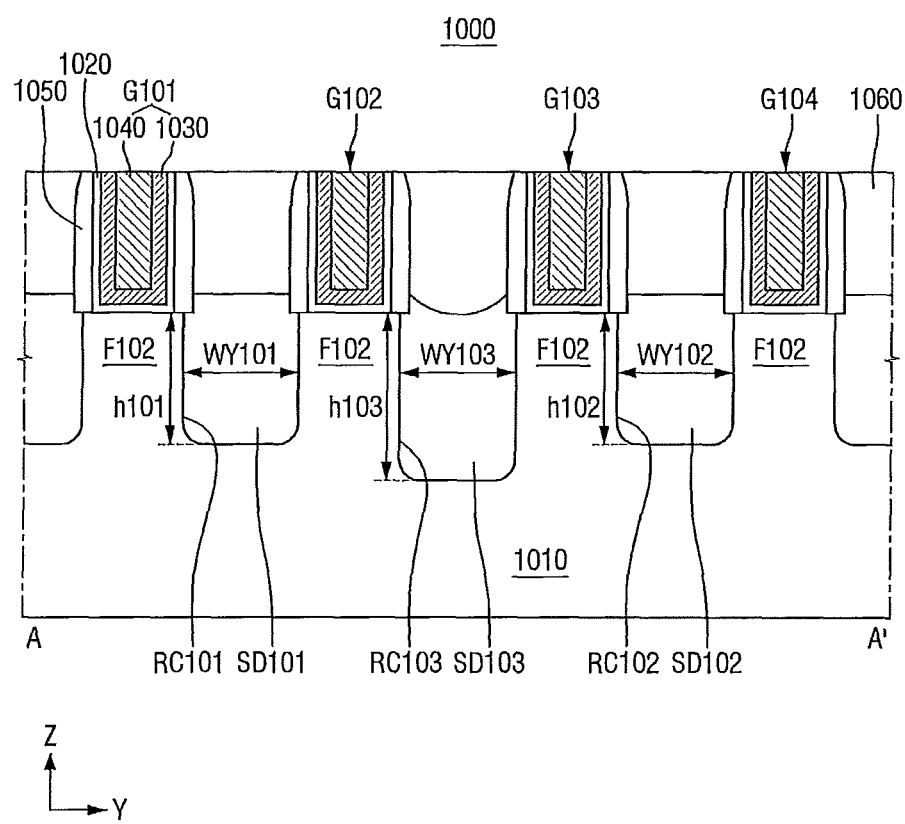
FIG. 18 is a cross-sectional view of a semiconductor device according to some embodiments of the present inventive concepts.

FIG. 18 is a cross-sectional view of the semiconductor device 1000 according to some embodiments of the present inventive concepts. FIG. 17 is a cross-sectional view taken along a line A-A' of FIG. 2.

Referring to FIG. 18, the semiconductor device 1000 may include a substrate 1010, first through fourth gate electrodes G101 through G104, a second fin active pattern F102, first through third source/drain regions SD101 through SD103, a gate insulating layer 1020, gate spacers 1050, and an interlayer insulating film 1060.

Like the first through eighth gate electrodes G11 through G18 illustrated in FIG. 3, each of the first through fourth gate electrodes G101 through G104 may include a work function metal 1030 and a fill metal 1040. The substrate 1010, the first through fourth gate electrodes G101 through G104, the second fin active pattern F102, the gate insulating layer 1020, the gate spacers 1050 and the interlayer insulating film 1060 are similar to the first through fourth gate electrodes G11 through G14, the second fin active pattern F12, the gate insulating layer 120, the gate spacers 150 and the interlayer insulating film 160 of FIG. 2 through FIG. 4.

As in the semiconductor device 100 illustrated in FIG. 3, in the semiconductor device 1000 illustrated in FIG. 18, a first width WY101 in the second direction Y of the first source/drain region SD101, which fills a first recess RC101, a second width WY102 in the second direction Y of the second source/drain region SD102, which fills a second recess RC102, and a third width WY103 in the second direction Y of the third source/drain region SD103, which fills a third recess RC103 may be equal to each other.

In addition, a third depth h103 in the third direction Z of the third recess RC103 from a top of the second fin active pattern F102 to a bottom of the third recess RC103 may be greater than a first depth h101 in the third direction Z of the first recess RC101 from a top of the second fin active pattern F102 to a bottom of the first recess RC101 and a second depth h102 in the third direction Z of the second recess RC102 from a top of the second fin active pattern F102 to a bottom of the second recess RC102.

However, in the semiconductor device 1000 illustrated in FIG. 18, unlike the semiconductor device 100 of FIG. 3, an upper surface of the third source/drain region SD103 may be concave. The upper surfaces of the first and second source/drain regions SD101 and SD102 may be substantially planar, that is flat. The upper surfaces of the first and second source/drain regions SD101 and SD102 may extend above the upper surface of the third source/drain region SD103 in the third direction Z.

A contact CA1 of a semiconductor device according to some embodiments of the present inventive concepts will now be described with reference to FIG. 19.

Figure 19:
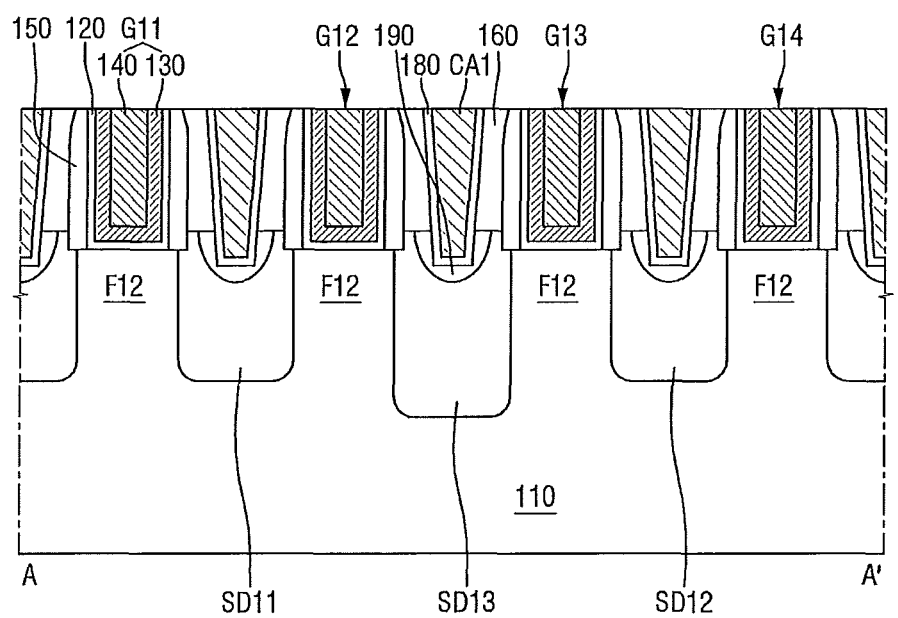
FIG. 19 is a cross-sectional view illustrating a contact of a semiconductor device according to some embodiments of the present inventive concepts.

FIG. 19 is a cross-sectional view illustrating a contact CA1 of a semiconductor device according to some embodiments of the present inventive concepts. The semiconductor device may be the semiconductor device 100 of FIG. 3 except the semiconductor device of FIG. 19 includes the contact CA1.

Referring to FIG. 19, the semiconductor device of FIG. 19 may further include the contact CA1, a barrier layer 180, and a silicide 190.

Specifically, the silicide 190 may be formed on a source/drain region, for example, on each of the first through third source/drain regions SD11 through SD13, in FIG. 19. The silicide 190 may be formed, for example, by deforming part of the source/drain region, for example, part of each of the first through third source/drain regions SD11 through SD13, in FIG. 19. That is, the silicide 190 may extend from an upper surface of each of the first through third source/drain regions SD11 through SD13 towards a bottom of each of the first through third source/drain regions SD11 through SD13 in a direction Z in a concave shape. The silicide 190 may include, for example, a metal. The metal may include, for example, at least one of Ni, Co, Pt, Ti, W, Hf, Yb, Tb, Dy, Er, Pd, and alloys of the same.

The contact CA1 may be formed on the source/drain region, for example, each of the first through third source/drain regions SD11 through SD13, in FIG. 19, formed in a substrate 110 between each pair of gate electrodes, for example, first through fourth gate electrodes G11 through G14, in FIG. 19, which intersect each fin active pattern, for example, second fin active pattern F12, in FIG. 19.

A contact hole may be formed to penetrate an interlayer insulating film 160 and expose part of the silicide 190. The contact hole may be spaced apart, or separated from the first through third source/drain regions SD11 through SD13 by the silicide 190 formed in each of the first through third source/drain regions SD11 through SD13. The contact CA1 may be formed on the barrier layer 180 which is conformally formed within the contact hole. That is, the barrier layer 180 may be conformally formed along sidewalls and a bottom of the contact hole and the contact CA1 may be formed on the barrier layer 180 to fill the contact hole. In the embodiment of FIG. 19, the contact hole may have a slope profile, that is, may become narrower as the distance from the top of the contact CA1 to the source/drain region, for example, each of the first through third source/drain regions SD11 through SD13, in FIG. 19, is reduced. That is, a width at a bottom of the contact CA1 may be smaller than a width at a top of the contact CAL

A contact CA2 of a semiconductor device according to some embodiments of the present inventive concepts will now be described with reference to FIG. 20.

Figure 20:
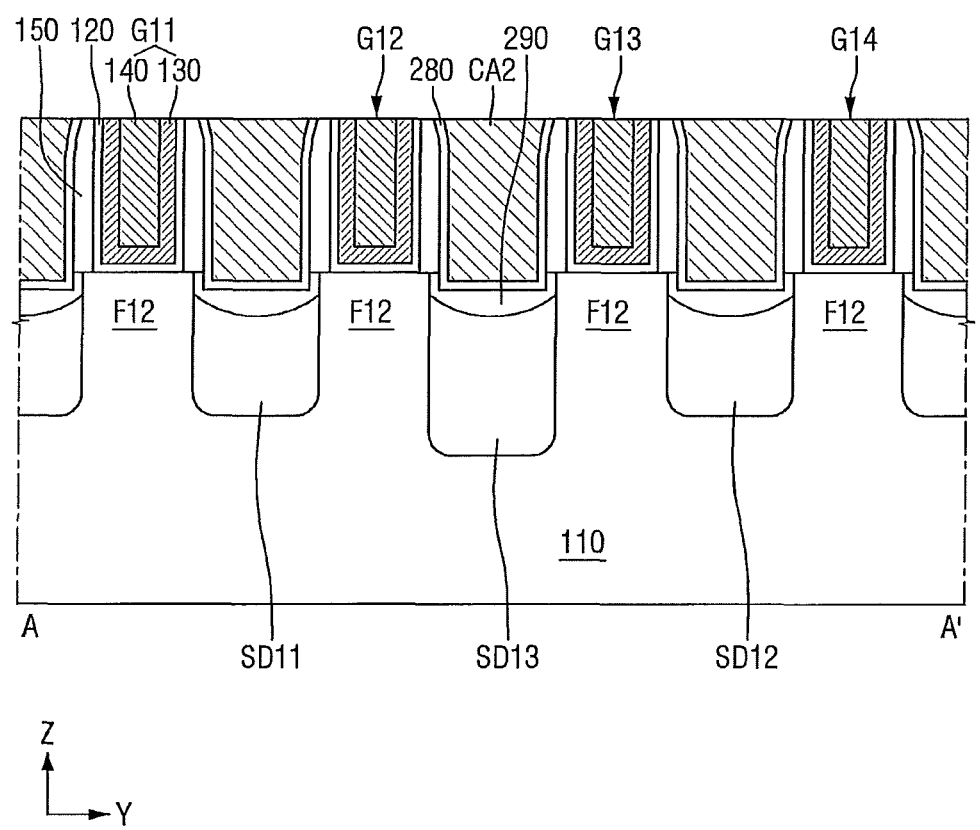
FIG. 20 is a cross-sectional view illustrating a contact of a semiconductor device according to some embodiments of the present inventive concepts.

FIG. 20 is a cross-sectional view illustrating the contact CA2 of a semiconductor device according to some embodiments of the present inventive concepts. The semiconductor device may be the semiconductor device 100 of FIG. 3 except the semiconductor device of FIG. 20 includes the contact CA2.

Referring to FIG. 20, the semiconductor device of FIG. 20 may further include the contact CA2, a barrier layer 280, and a silicide 290.

Specifically, the silicide 290 may be formed on a source/drain region, for example, each of the first through third source/drain regions SD11 through SD13, in FIG. 20. The silicide 290 may be formed by, for example, deforming part of the source/drain region, for example, part of each of the first through third source/drain regions SD11 through SD13, in FIG. 20. That is, the silicide 290 may extend from an upper surface of each of the first through third source/drain regions SD11 through SD13 towards a bottom of each of the first through third source/drain regions SD11 through SD13 in a direction Z in a concave shape. The silicide 290 may include, for example, a metal. The metal may include, for example, at least one of Ni, Co, Pt, Ti, W, Hf, Yb, Tb, Dy, Er, Pd, and alloys of the same.

The contact CA2 may be formed on the source/drain region, for example, each of the first through third source/drain regions SD11 through SD13, in FIG. 20, formed in a substrate 110 between each pair of gate electrodes, for example, the first through fourth gate electrodes G11 through G14, in FIG. 20, which intersect each fin active pattern, for example, the second fin active pattern F12, in FIG. 20. A contact hole may be formed between each pair of gate electrodes, for example the first through fourth gate electrodes G11 through G14, exposing sidewalls of the gate spacers 150 and may expose part of the silicide 290. The contact hole may be spaced apart, or separated from the first through third source/drain regions SD11 through SD13 by the silicide 290 formed in each of the first through third source/drain regions SD11 through SD13.

The contact CA2 may be formed on the barrier layer 280 which is conformally formed on sidewalls of gate spacers 150 and the source/drain region, for example, each of the first through third source/drain regions SD11 through SD13, in FIG. 20. That is, the barrier layer 280 may be conformally formed along sidewalls of the gate spacers 150 and along the exposed part of the silicide 290 and the contact CA2 may be formed on the barrier layer 280 to fill the contact hole.

Although a few embodiments of the present general inventive concepts have been shown and described, it will be appreciated by those skilled in the art that changes may be made in these embodiments without departing from the principles and spirit of the general inventive concepts, the scope of which is defined in the appended claims and their equivalents.

What is claimed is:

1. A semiconductor device comprising:
a substrate;
first through fourth gate electrodes extending in a first direction on the substrate and being sequentially separated from each other in a second direction perpendicular to the first direction;
a first fin active pattern extending in the second direction and intersecting the second and third gate electrodes;
a second fin active pattern extending in the second direction, being separated from the first fin active pattern in the first direction, and intersecting the first through fourth gate electrodes;
a third fin active pattern extending in the second direction, being separated from the second fin active pattern in the first direction, and intersecting the first and second gate electrodes;
a fourth fin active pattern extending in the second direction, being separated from the third fin active pattern in the second direction, and intersecting the third and fourth gate electrodes;
a fifth fin active pattern extending in the second direction, being separated from the third and fourth fin active patterns in the first direction, and intersecting the first through fourth gate electrodes;
a first recess in the substrate between the first and second gate electrodes intersecting the second fin active pattern, the first recess being filled with a first source/drain region, and having a first depth in a third direction perpendicular to the first and second directions;
a second recess in the substrate between the third and fourth gate electrodes intersecting the second fin active pattern, the second recess being filled with a second source/drain region, and having a second depth in the third direction; and
a third recess which in the substrate between the second and third gate electrodes intersecting the second fin active pattern, is the third recess being filled with a third source/drain region, and having a third depth in the third direction,
wherein the third depth is greater than the first depth and the second depth.

2. The semiconductor device of claim 1, wherein a third width in the second direction of the third recess is greater than a first width in the second direction of the first recess and a second width in the second direction of the second recess.

3. The semiconductor device of claim 2, wherein the first width in the second direction of the first recess is different from the second width in the second direction of the second recess.

4. The semiconductor device of claim 1, wherein the first depth in the third direction of the first recess is different from the second depth in the third direction of the second recess.

5. The semiconductor device of claim 1, wherein a first distance between a second portion of the second gate electrode intersecting the first fin active pattern and a second portion of the third gate electrode intersecting the first fin active pattern is smaller than a second distance between a first portion of the second gate electrode intersecting the second fin active pattern and a first portion of the third gate electrode intersecting the second fin active pattern.

6. The semiconductor device of claim 5, wherein a third distance between a third portion of the second gate electrode intersecting the third fin active pattern and a third portion of the third gate electrode intersecting the fourth fin active pattern is smaller than the second distance.

7. The semiconductor device of claim 1, wherein the third recess has a slope profile in which the third recess becomes narrower in the second direction as a distance from a top of the third recess to the substrate is reduced.

8. The semiconductor device of claim 1, wherein a lower portion of the third recess is U-shaped.

9. A semiconductor device comprising:
a substrate comprising a first region and a second region;
a first gate electrode extending in a first direction on the first region;
a second gate electrode extending in the first direction on the first region and being separated from the first gate electrode in a second direction perpendicular to the first direction;
a third gate electrode extending in the first direction on the second region and being separated from the second gate electrode in the second direction;
a fourth gate electrode extending in the first direction on the second region and being separated from the third gate electrode in the second direction;
a first fin active pattern extending in the second direction on the first and second regions and intersecting the first through fourth gate electrodes;
a second fin active pattern extending in the second direction on the first region, being separated from the first fin active pattern in the first direction, and intersecting the first and second gate electrodes;
a third fin active pattern extending in the second direction on the second region, being separated from the second fin active pattern in the second direction, and intersecting the third and fourth gate electrodes;
a first source/drain region in the first region between the first and second gate electrodes intersecting the first fin active pattern and having a first depth in a third direction perpendicular to the first and second directions;
a second source/drain region in the second region between the third and fourth gate electrodes intersecting the first fin active pattern and having a second depth in the third direction; and a third source/drain region in the first and second regions between the second and third gate electrodes intersecting the first fin active pattern and having a third depth in the third direction,
wherein the third depth is greater than the first depth and the second depth.

10. The semiconductor device of claim 9, wherein a third width in the second direction of the third source/drain region is greater than a first width in the second direction of the first source/drain region and a second width in the second direction of the second source/drain region.

11. The semiconductor device of claim 10, wherein the first width in the second direction of the first source/drain region is different from the second width in the second direction of the second source/drain region.

12. The semiconductor device of claim 9, wherein the first depth in the third direction of the first source/drain region is different from the second depth in the third direction of the second source/drain region.

13. The semiconductor device of claim 9, wherein a sixth width in the first direction of the third source/drain region is greater than a fourth width in the first direction of the first source/drain region and a fifth width in the first direction of the second source/drain region.

14. The semiconductor device of claim 9, wherein an upper surface of the first source/drain region and an upper surface of the second source/drain region are convex.

15. The semiconductor device of claim 9, wherein an upper surface of the third source/drain region is concave.

16. A semiconductor device comprising:
a substrate comprising a first region and a second region;
a first gate electrode extending in a first direction on the first region;
a second gate electrode extending in the first direction on the first region and being separated from the first gate electrode in a second direction perpendicular to the first direction;
a third gate electrode extending in the first direction on the second region and being separated from the second gate electrode in the second direction;
a fourth gate electrode extending in the first direction on the second region and being separated from the third gate electrode in the second direction;
a plurality of fin active patterns extending in the second direction and spaced apart from each other in the first direction;
a first source drain region in the first region between the first and second gate electrodes intersecting one of the plurality of fin active patterns and having a first depth in a third direction perpendicular to the first and second directions;
a second source/drain region in the second region between the third and fourth gate electrodes intersecting the one of the plurality of fin active patterns and having a second depth in the third direction; and
a third source/drain region in the first and second regions between the second and third gate electrodes intersecting the one of the plurality of fin active patterns and having a third depth in the third direction,
wherein the third depth is greater than the first depth and the second depth.

17. The semiconductor device of claim 16, wherein the plurality of fin active patterns comprise:
a first fin active pattern extending in the second direction and intersecting the second and third gate electrodes;
a second fin active pattern extending in the second direction, being separated from the first fin active pattern in the first direction, and intersecting the first through fourth gate electrodes;
a third fin active pattern extending in the second direction, being separated from the second fin active pattern in the first direction, and intersecting the first and second gate electrodes;
a fourth fin active pattern extending in the second direction, being separated from the third fin active pattern in the second direction, and intersecting the third and fourth gate electrodes; and
a fifth fin active pattern extending in the second direction, being separated from the third and fourth fin active patterns in the first direction, and intersecting the first through fourth gate electrodes.

18. The semiconductor device of claim 16, wherein the first depth in the third direction of the first source/drain region is different from the second depth in the third direction of the second source/drain region.

19. The semiconductor device of claim 16, wherein a third width in the second direction of the third source/drain region is greater than a first width in the second direction of the first source/drain region and a second width in the second direction of the second source/drain region.

20. The semiconductor device of claim 16, wherein a sixth width in the first direction of the third source/drain region is greater than a fourth width in the first direction of the first source/drain region and a fifth width in the first direction of the second source/drain region.

* * * * *